(12) United States Patent
Sridhar

(10) Patent No.: US 8,574,979 B2
(45) Date of Patent: Nov. 5, 2013

(54) METHOD FOR INTEGRATING SILICON GERMANIUM AND CARBON DOPED SILICON WITH SOURCE/DRAIN REGIONS IN A STRAINED CMOS PROCESS FLOW

(75) Inventor: Seetharaman Sridhar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/599,927

(22) PCT Filed: May 19, 2008

(86) PCT No.: PCT/US2008/064077
§ 371 (c)(1),
(2), (4) Date: Nov. 12, 2009

(87) PCT Pub. No.: WO2008/144625
PCT Pub. Date: Nov. 27, 2008

(65) Prior Publication Data
US 2010/0224937 A1    Sep. 9, 2010

Related U.S. Application Data

(63) Continuation of application No. 11/750,690, filed on May 18, 2007, now abandoned.

(51) Int. Cl.
*H01L 21/263* (2006.01)
*H01L 21/8238* (2006.01)

(52) U.S. Cl.
USPC .... 438/231; 438/275; 438/300; 257/E21.611; 257/E1.632

(58) Field of Classification Search
USPC .......... 438/199, 231, 275, 300; 257/E21.625, 257/632, 639, E21.611
See application file for complete search history.

(56) References Cited

U.S. PATENT DOCUMENTS

| | | | |
|---|---|---|---|
| 5,959,333 A | 9/1999 | Gardner et al. | |
| 6,117,737 A * | 9/2000 | Wang et al. | 438/275 |
| 6,165,826 A * | 12/2000 | Chau et al. | 438/231 |
| 6,306,702 B1 * | 10/2001 | Hao et al. | 438/231 |
| 6,744,104 B1 | 6/2004 | Aoki et al. | |
| 7,026,232 B1 * | 4/2006 | Koontz et al. | 438/589 |
| 7,195,985 B2 | 3/2007 | Murthy et al. | |
| 7,288,822 B1 | 10/2007 | Ting et al. | |
| 7,402,496 B2 * | 7/2008 | Liu et al. | 438/300 |

(Continued)

*Primary Examiner* — Anh Mai
(74) *Attorney, Agent, or Firm* — Warren L. Franz; Wade J. Brady, III; Frederick J. Telecky, Jr.

(57) ABSTRACT

The disclosure provides a semiconductor device and method of manufacture therefore. The method for manufacturing the semiconductor device, in one embodiment, includes providing a substrate (210) having a PMOS device region (220) and NMOS device region (260). Thereafter, a first gate structure (240) and a second gate structure (280) are formed over the PMOS device region and the NMOS device region, respectively. Additionally, recessed epitaxial SiGe regions (710) may be formed in the substrate on opposing sides of the first gate structure. Moreover, first source/drain regions may be formed on opposing sides of the first gate structure and second source/drain regions on opposing sides of the second gate structure. The first source/drain regions and second source/drain regions may then be annealed to form activated first source/drain regions (1110) and activated second source/drain regions (1120), respectively. Additionally, recessed epitaxial carbon doped silicon regions (1410) may be formed in the substrate on opposing sides of the second gate structure after annealing.

23 Claims, 22 Drawing Sheets

(56) References Cited

U.S. PATENT DOCUMENTS

| | | | |
|---|---|---|---|
| 7,514,309 B2* | 4/2009 | Sridhar et al. | 438/199 |
| 7,985,641 B2* | 7/2011 | Kim et al. | 438/199 |
| 2005/0035409 A1 | 2/2005 | Ko et al. | |
| 2005/0215037 A1* | 9/2005 | Lu et al. | 438/583 |
| 2005/0266631 A1 | 12/2005 | Kim et al. | |
| 2006/0024898 A1* | 2/2006 | Chidambaram et al. | 438/303 |
| 2006/0115949 A1* | 6/2006 | Zhang et al. | 438/300 |
| 2006/0134873 A1* | 6/2006 | Koontz | 438/301 |
| 2007/0020839 A1* | 1/2007 | Sridhar et al. | 438/199 |
| 2008/0153221 A1* | 6/2008 | Sridhar et al. | 438/230 |
| 2008/0277735 A1 | 11/2008 | Ko et al. | |
| 2008/0283926 A1* | 11/2008 | Sridhar | 257/369 |
| 2008/0283936 A1* | 11/2008 | Sridhar et al. | 257/401 |

* cited by examiner

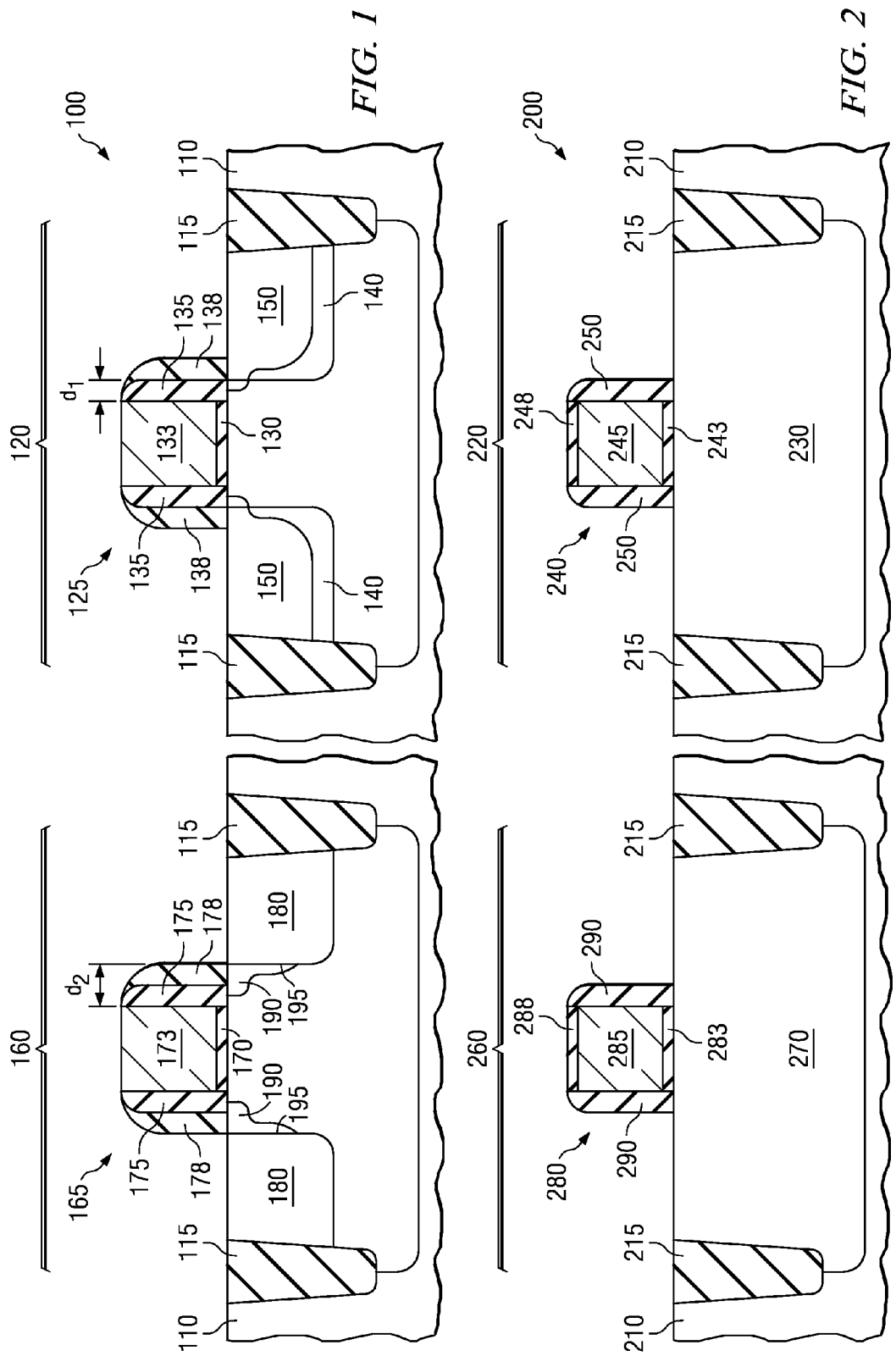

METHOD FOR INTEGRATING SILICON GERMANIUM AND CARBON DOPED SILICON WITH SOURCE/DRAIN REGIONS IN A STRAINED CMOS PROCESS FLOW

The disclosure is directed, in general, to manufacture of a semiconductor device and, more specifically, to a method for integrating silicon germanium and carbon doped silicon source/drain regions within a strained CMOS device fabrication process flow, and to a semiconductor device manufactured therefrom.

BACKGROUND

There exists a continuing need to improve semiconductor device performance and further scale semiconductor devices. A characteristic that limits scalability and device performance is electron and/or hole mobility (e.g., also referred to as channel mobility) throughout the channel region of transistors. As devices continue to shrink in size, the channel region also continues to shrink in size, which can limit channel mobility.

One technique that may improve scaling limits and device performance is to introduce strain into the channel region, which can improve electron and/or hole mobility. Different types of strain, including expansive strain, uniaxial tensile strain, and compressive strain, have been introduced into channel regions of various types of transistors in order to determine their effect on electron and/or hole mobility. For some devices, certain types of strain improve mobility whereas other types degrade mobility.

One process known and used to create strain within the channel region is to form a layer of strain inducing material over the gate structure. The strain inducing material may then be subjected to an annealing process to create the strain within the channel region. Unfortunately, it has been observed that the introduction of just one kind of strain into the channel region using such a strain-inducing layer is insufficient to support some of the next generation devices.

Accordingly, what is needed in the art is an improved method for manufacturing a semiconductor device that provides improved channel mobility and/or lowered source/drain resistance.

SUMMARY

The invention provides a semiconductor device and method of manufacture therefor.

In an embodiment, a method for manufacturing the semiconductor device includes providing a substrate having a P-type metal oxide semiconductor (PMOS) device region and an N-type metal oxide semiconductor (NMOS) device region. Thereafter, a first gate structure and a second gate structure are formed over the PMOS device region and the NMOS device region, respectively. Additionally, recessed epitaxial silicon germanium regions may be formed in the substrate on opposing sides of the first gate structure. Moreover, first source/drain regions and second source/drain regions may be formed on opposing sides of the first gate structure and second gate structure, respectively. The method may further include annealing the first source/drain regions and second source/drain regions to form activated first source/drain regions and activated second source/drain regions, respectively. The method may additionally include forming recessed epitaxial carbon doped silicon regions in the substrate on opposing sides of the second gate structure after annealing.

In an embodiment, a semiconductor device may include a p-type metal oxide semiconductor (PMOS) device region located over a substrate. The PMOS device region, in one embodiment, may include 1) a first gate structure located over the substrate, 2) activated first source/drain regions located in the substrate on opposing sides of the first gate structure, and 3) recessed epitaxial silicon germanium regions located in the substrate on opposing sides of the first gate structure. The NMOS device region, in one embodiment, may include: 1) a second gate structure located over the substrate, 2) activated second source/drain regions located in the substrate on opposing sides of the second gate structure, and 3) recessed epitaxial carbon doped silicon regions located in the substrate and adjacent the activated second source/drain regions, and further wherein a physical interface separates the recessed epitaxial carbon doped silicon regions and the activated second source/drain regions.

BRIEF DESCRIPTION OF THE DRAWINGS

Example embodiments are given below with reference to accompanying drawings, in which:

FIG. 1 illustrates a semiconductor device manufactured in accordance with an example embodiment;

FIGS. 2-14 illustrate steps of one example embodiment for manufacturing a semiconductor device in accordance with this disclosure;

DETAILED DESCRIPTION OF EXAMPLE EMBODIMENTS

Figure 3:
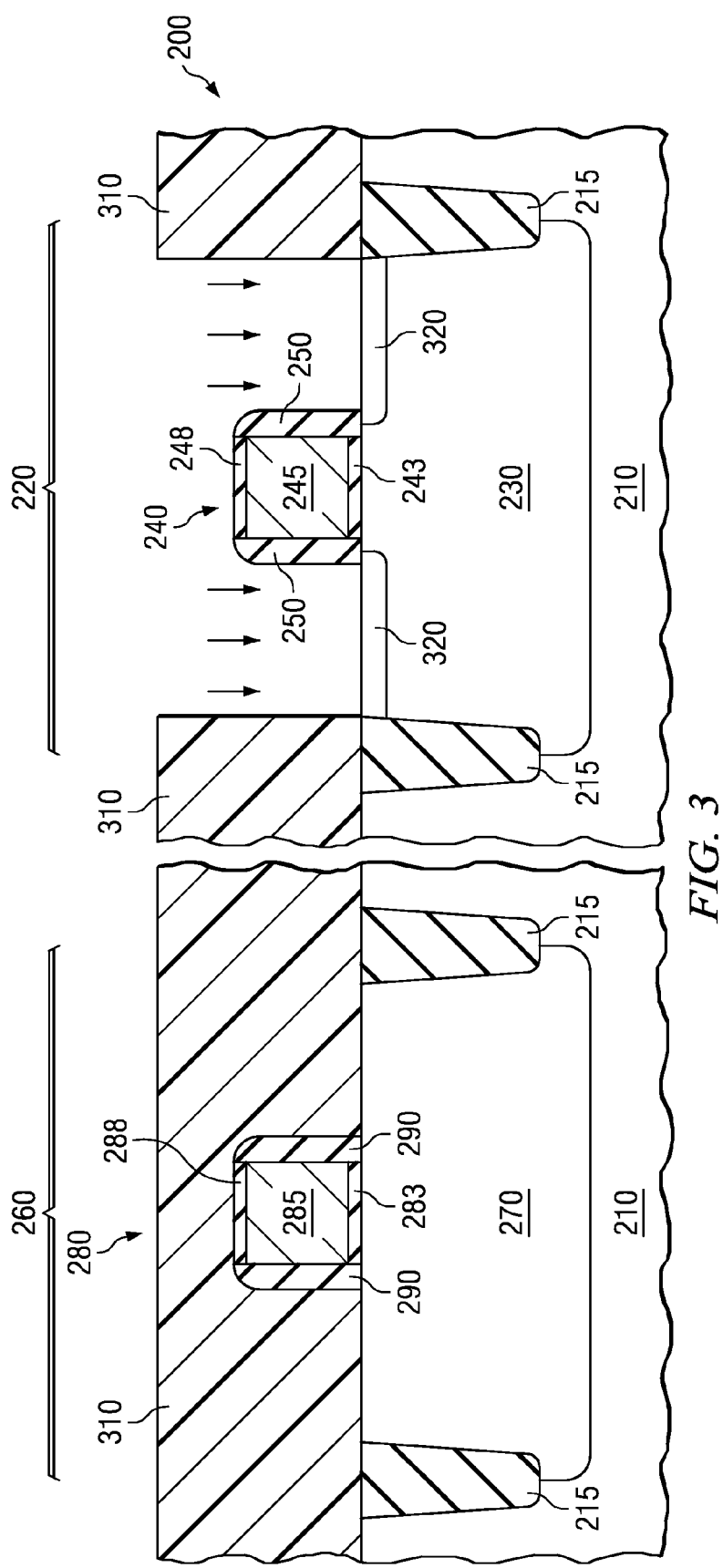

It was recognized that recessed epitaxial silicon germanium regions and recessed epitaxial carbon doped silicon regions may be concurrently used within a complementary metal oxide semiconductor (CMOS) device flow. It was further recognized that recessed epitaxial carbon doped silicon regions are subject to degradation when subjected to thermal anneal processes. For instance, it was recognized that in typical recessed epitaxial carbon doped silicon regions the carbon substitutes for each silicon lattice, however, when the epitaxial carbon doped silicon regions are subjected to a significant thermal anneal the carbon stops being substitutional. Based at least in part on the foregoing, it was recognized that in certain embodiments the recessed carbon doped silicon regions should be formed after all significant thermal anneal processes have been conducted. In one embodiment this includes forming the carbon doped silicon regions after the formation of all source/drain regions.

FIG. 1 illustrates a semiconductor device 100 manufactured in accordance with an example embodiment. The semiconductor device 100 includes a substrate 110. Located within the substrate 110 are isolation regions 115. The isolation regions 115 of FIG. 1 are depicted as shallow trench isolation (STI) regions. Nevertheless, any other type isolation region may be used, for example field oxide regions (also known as "LOCOS" regions), implanted isolation regions, etc.

The substrate 110 of FIG. 1 further includes a PMOS device region 120 and an NMOS device region 160. In the example embodiment of FIG. 1, the isolation regions 115 help define the boundaries of the PMOS device region 120 and the NMOS device region 160. Nevertheless, other features or structures could be used to define such boundaries.

The PMOS device region 120 of FIG. 1 includes a first gate structure 125 located over the substrate 110. The first gate structure 125, in this embodiment, includes a first gate dielectric 130, a first gate electrode 133, gate sidewall spacers 135 and source/drain spacers 138. The first gate dielectric 130, first gate electrode 133, gate sidewall spacers 135 and source/drain spacers 138 may comprise many different materials, conventional and not, and remain within the scope of this disclosure.

The PMOS device region 120 of FIG. 1 further includes recessed epitaxial silicon germanium ("SiGe") regions 140. The SiGe regions 140, in the example embodiment, are located in the substrate 110 on opposing sides of the first gate structure 125. Moreover, the SiGe regions 140 are offset from a sidewall of the gate structure 125 using at least a portion of the gate sidewall spacers 135, for example by a distance ($d_1$). While the SiGe regions 140 appear to have substantially vertical sidewalls, certain other embodiments exist wherein the SiGe regions 140 have sidewalls that angle under the gate structure 125. In this embodiment the SiGe regions 140 would be offset from the sidewall of the gate structure 125 by a maximum distance ($d_1$).

The SiGe regions 140 are employed within the PMOS device region 120 to improve transistor performance by increasing the mobility of the carriers in the channel thereof. It is believed that the improvement is a result of the lattice mismatch that induces mechanical stress or strain across the channel regions. Specifically, a compressive-strained channel typically provides the hole mobility enhancement that is beneficial for the PMOS device region 120.

The PMOS device region 120 further includes activated first source/drain regions 150 located on opposing sides of the first gate structure 125. Each of the activated first source/drain regions 150, or at least a portion thereof, is located within one of the SiGe regions 140 in the embodiment of FIG. 1. The activated first source/drain regions 150, in the embodiment of FIG. 1, include first extension implants and first source/drain implants.

The substrate 110 further includes the NMOS device region 160. The NMOS device region 160 includes a second gate structure 165 located over the substrate 110. The second gate structure 165, in this embodiment, includes a second gate dielectric 170, a second gate electrode 173, gate sidewall spacers 175, and source/drain spacers 178. Similar to above, the second gate dielectric 170, second gate electrode 173, gate sidewall spacers 175 and source/drain spacers 178 may comprise many different materials, conventional and not.

The NMOS device region 160 of FIG. 1 further includes recessed carbon doped silicon ("SiC" or "silicon carbon") regions 180. The SiC regions 180, in the example embodiment, are located in the substrate 110 on opposing sides of the second gate structure 165. Moreover, the SiC regions 180 are offset from a sidewall of the gate structure 165 using the gate sidewall spacers 175 and source/drain spacers 178, for example by a distance ($d_2$). In the example embodiment, the distance ($d_2$) is greater than the distance ($d_1$). This, among other reasons, is a result of the process used to manufacture the device 100. While the SiC regions 180 appear to have substantially vertical sidewalls, certain other embodiments exist wherein the SiC regions 180 have sidewalls that angle under the gate structure 165. In this embodiment the SiC regions 180 would be offset from the sidewall of the gate structure 165 by a maximum distance ($d_2$).

The SiC regions 180 are employed within the NMOS device region 160 to improve transistor performance by increasing the mobility of the carriers in the channel thereof. It is believed that the improvement is a result of the lattice mismatch that induces mechanical stress or strain across the channel regions. Specifically, a tensile-strained channel typically provides the hole mobility enhancement that is beneficial for the NMOS device region 160.

The NMOS device region 160 further includes activated second source/drain regions 190 located on opposing sides of the second gate structure 165. Each of the activated second source/drain regions 190, at least in the example embodiment of FIG. 1, further includes second extension implants and second source/drain implants. As a result of the process used to manufacture the device 100, an interface 195 separates the activated second source/drain regions 190 and the SiC regions 180. For instance, in one embodiment the activated source/drain regions 190 do not extend at all into the SiC regions 180. Nevertheless, the SiC regions 180 may be doped, for example using an N-type dopant such as phosphorous, to facilitate conductivity to the activated second source/drain regions 190.

The semiconductor device 100 of FIG. 1 benefits significantly by collectively using the recessed epitaxial silicon germanium regions 140 in the PMOS device region 120 and the recessed epitaxial SiC regions 180 in the NMOS device region 160. For example, both the PMOS device region 120 and NMOS device region 160 experience improved channel mobility therefrom. Heretofore the disclosure, these two features were not formed in a same process for fabrication of a semiconductor device comprising a PMOS device region and an NMOS device region with the recessed epitaxial SiC regions formed after source/drain implants.

FIGS. 2-14 illustrate steps of one example embodiment for manufacturing a semiconductor device in accordance with this disclosure. FIG. 2 illustrates a semiconductor device 200 at an initial stage of manufacture. The device 200 includes a substrate 210. The substrate 210 may, in one embodiment, be any layer located in the device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the disclosure. In such an embodiment, certain ones of the dopant types described throughout the remainder of this document might be reversed. For clarity, no further reference to this opposite scheme will be discussed.

Located within the substrate 210 in FIG. 2 are isolation regions 215. The isolation regions 215 are configured to isolate various device features of the device 200 from one another. In the illustrative embodiment of FIG. 2, the isolation regions 215 are shallow trench isolation structures. Nevertheless, the isolation regions 215 may comprise various other types of isolation structures. As those skilled in the art understand the various steps used to form the isolation regions 215, whether they are shallow trench isolation structures, LOCOS isolation structures, or another structure, no further detail will be given.

The substrate 210 of FIG. 2 includes two device regions. For example, the substrate 210 includes a PMOS device region 220 and an NMOS device region 260. Other embodiments may exist wherein the substrate 210 includes multiple PMOS device regions 220 and/or multiple NMOS device regions 260.

Located within the substrate 210 in the PMOS device region 220 is a well region 230. The well region 230, in the embodiment of FIG. 2, contains an N-type dopant. For example, the well region 230 would likely be doped with an N-type dopant dose ranging from about $1E13$ atoms/cm$^2$ to about $1E14$ atoms/cm$^2$ and at an energy ranging from about 100 keV to about 500 keV. This may result in the well region 230 having a peak dopant concentration ranging from about 5E17 atoms/cm$^3$ to about 1E19 atoms/cm$^3$.

Located over the well region 230 is a first gate structure 240. The gate structure 240 includes a first gate dielectric 243, a first gate electrode 245, a gate hardmask 248, and gate sidewall spacers 250. The gate dielectric 243 may comprise a number of different materials and stay within the scope of the disclosure. For example, the gate dielectric 243 may comprise silicon dioxide, or in an alternative embodiment comprise a high dielectric constant (K) material. In the illustrative embodiment of FIG. 2, however, the gate dielectric 243 is a silicon dioxide layer having a thickness ranging from about 0.5 nm to about 5 nm.

Any one of a plurality of manufacturing techniques could be used to form the gate dielectric 243. For example, the gate dielectric 243 may be either grown or deposited. Additionally, the growth or deposition steps may require a significant number of different temperatures, pressures, gasses, flow rates, etc.

While the embodiment of FIG. 2 discloses that the gate electrode 245 comprises standard polysilicon, other embodiments exist where the gate electrode 245, or at least a portion thereof, comprises amorphous polysilicon material, a metal material, or fully silicided metal material. The amorphous polysilicon embodiment may be particularly useful when a substantially planar upper surface of the gate electrode 245 is desired.

The deposition conditions for the gate electrode 245 may vary. However, if the gate electrode 245 were to comprise standard polysilicon, such as the instance in FIG. 2, the gate electrode 245 could be deposited using a pressure ranging from about 100 Torr to about 300 Torr, a temperature ranging from about 620° C. to about 700° C., and a SiH$_4$ or Si$_2$H$_6$ gas flow ranging from about 50 sccm to about 150 sccm. If the gate electrode 245 were to comprise a different material, other suitable deposition conditions might be used. The gate electrode 245, in various embodiments, may have a thickness ranging from about 50 nm to about 150 nm, among others. Additionally, the gate electrode 245 may, in one optional embodiment, be conductively doped prior to the formation of the gate hardmask 248, and thus prior to the patterning of the gate structure 240.

The gate hardmask 248 may comprise various different materials. In one embodiment, however, the gate hardmask 248 comprises silicon nitride. In alternative embodiments, the gate hardmask 245 may comprise silicon carbide or silicon oxynitride, among others. Those skilled in the art understand the processes, whether conventional or not, that might be used to form the gate hardmask 248.

The gate sidewall spacers 250 of the first gate structure 240 may comprise many different materials. In the particular embodiment of FIG. 2 the gate sidewall spacers 250 comprise silicon nitride. Nevertheless, in other embodiments the gate sidewall spacers 250 may comprise silicon dioxide, silicon carbide or silicon oxynitride, without limitation. In certain embodiments, it is important that the gate sidewall spacers 250 and the gate hardmask 248 comprise different materials. In these embodiments, the difference in material allows one feature to be selectively removed without significant removal of the other feature. In other embodiments, however, the gate sidewall spacers 250 and gate hardmask 248 comprise the same material.

Those skilled in the art understand the processes that might be used to form the gate sidewall spacers 250. For example, in one embodiment a conformal layer of gate sidewall material is deposited on the gate structure 240 and the substrate 210 using a chemical vapor deposition (CVD) process to an appropriate thickness. Thereafter, the conformal layer of gate sidewall material is subjected to an anisotropic etch, thus resulting in the gate sidewall spacers 250.

Located within the substrate 210 in the NMOS device region 260 is a well region 270. The well region 270, as a result of being located within the NMOS device region 260, would generally contain a P-type dopant. For example, the well region 270 would likely be doped with a P-type dopant dose ranging from about 1E13 atoms/cm$^2$ to about 1E14 atoms/cm$^2$ and at an energy ranging from about 100 keV to about 500 keV. This may result in the well region 270 having a peak dopant concentration ranging from about 5E17 atoms/cm$^3$ to about 1E19 atoms/cm$^3$. Those skilled in the art understand that in certain circumstances where the P-type substrate 210 dopant concentration is high enough, the well region 270 may be excluded.

Located over the well region 270 is a second gate structure 280. The gate structure 280 includes a second gate dielectric 283, a second gate electrode 285, a gate hardmask 288, and gate sidewall spacers 290. Each of the second gate dielectric 283, second gate electrode 285, gate hardmask 288, and gate sidewall spacers 290 may comprise similar materials and be formed using similar processes as each of the first gate dielectric 243, first gate electrode 245, gate hardmask 248, and gate sidewall spacers 250, respectively. The gate electrode 285 may, in one optional embodiment, be conductively doped prior to the formation of the gate hardmask 288, and thus prior to the patterning of the gate structure 280. In many instances, the related features are formed using the same processing steps, and only thereafter patterned resulting in the first gate structure 240 and the second gate structure 280.

FIG. 3 illustrates the device 200 of FIG. 2 after patterning a resist layer 310 to expose at least a portion of the PMOS device region 220 and forming extension implants 320 within the substrate 210. Those skilled in the art understand the process of patterning the resist layer 310. For example, in one embodiment a radiation sensitive resist coating (e.g., a conformal layer of resist) would be formed over the substrate 210. The radiation sensitive resist coating would then be patterned by selectively exposing the resist through a mask. In turn, the exposed areas of the coating become either more or less soluble than the unexposed areas, depending on the type of resist. A solvent developer would then be used to remove the less soluble areas leaving the patterned resist layer 310.

In the embodiment of FIG. 3 the extension implants 320 have also been formed within the substrate 210 in the PMOS device region 220. In the given embodiment, the patterned resist layer 310 and the first gate structure 240 help position the extension implants 320 within the substrate. The extension implants 320 may be conventionally formed and generally have a peak dopant concentration ranging from about 1E19 atoms/cm$^3$ to about 2E20 atoms/cm$^3$. As is standard in the industry, the implants 320 should have a dopant type opposite to that of the well region 230 they are located within. Accordingly, the implants 320 of FIG. 4 are doped with a P-type dopant.

Figure 4:
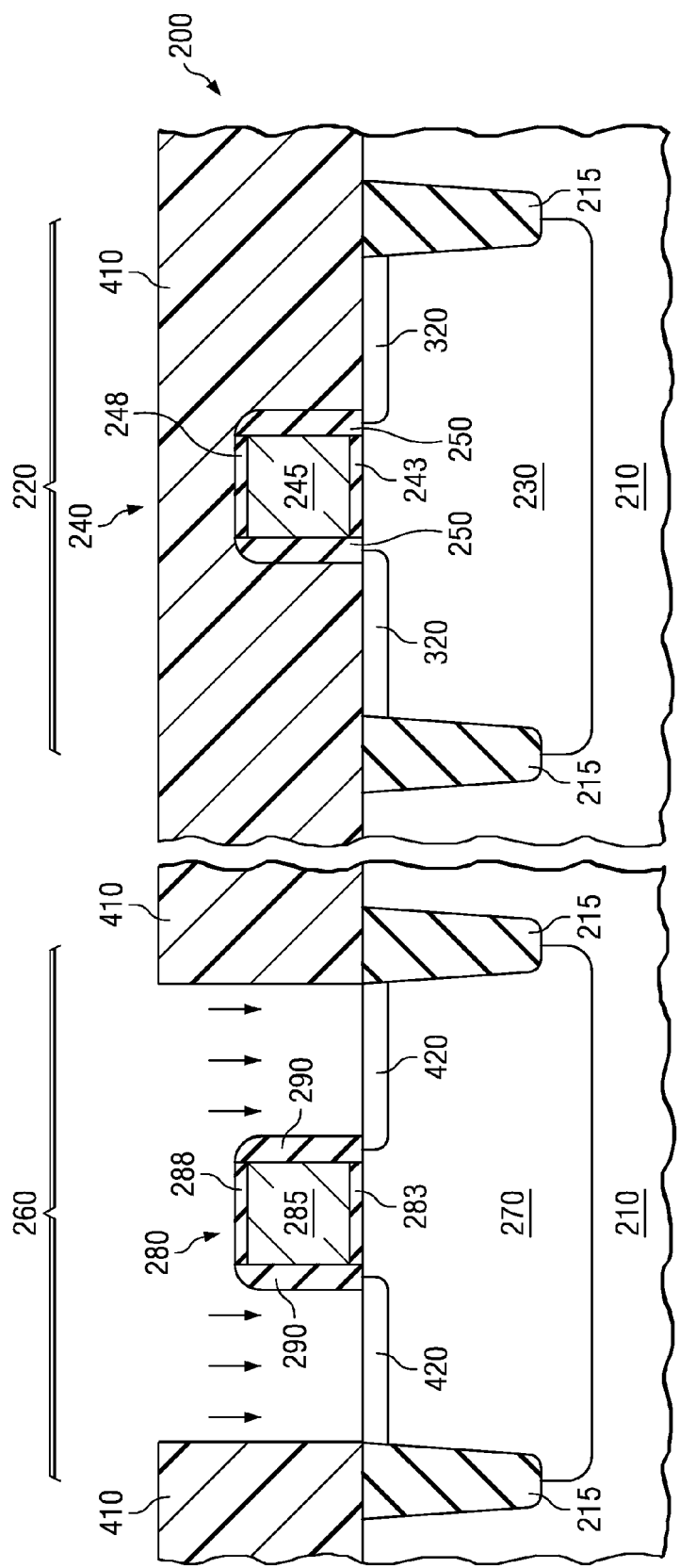

FIG. 4 illustrates the device 200 of FIG. 3 after patterning a resist layer 410 to expose the NMOS device region 260 and thereafter forming extension implants 420 within the substrate 210. The patterned resist layer 410 may be formed using a similar process as previously used to form the patterned resist layer 310. In the example embodiment, the patterned resist layer 410 and the second gate structure 280 help position the extension implants 420 within the substrate. The extension implants 420 may be conventionally formed and generally have a peak dopant concentration ranging from about 1E19 atoms/cm$^3$ to about 2E20 atoms/cm$^3$. As is standard in the industry, the implants 420 should have a dopant type opposite to that of the well region 270 they are located within. Accordingly, the implants 420 of FIG. 4 are doped with an N-type dopant.

Figure 5:
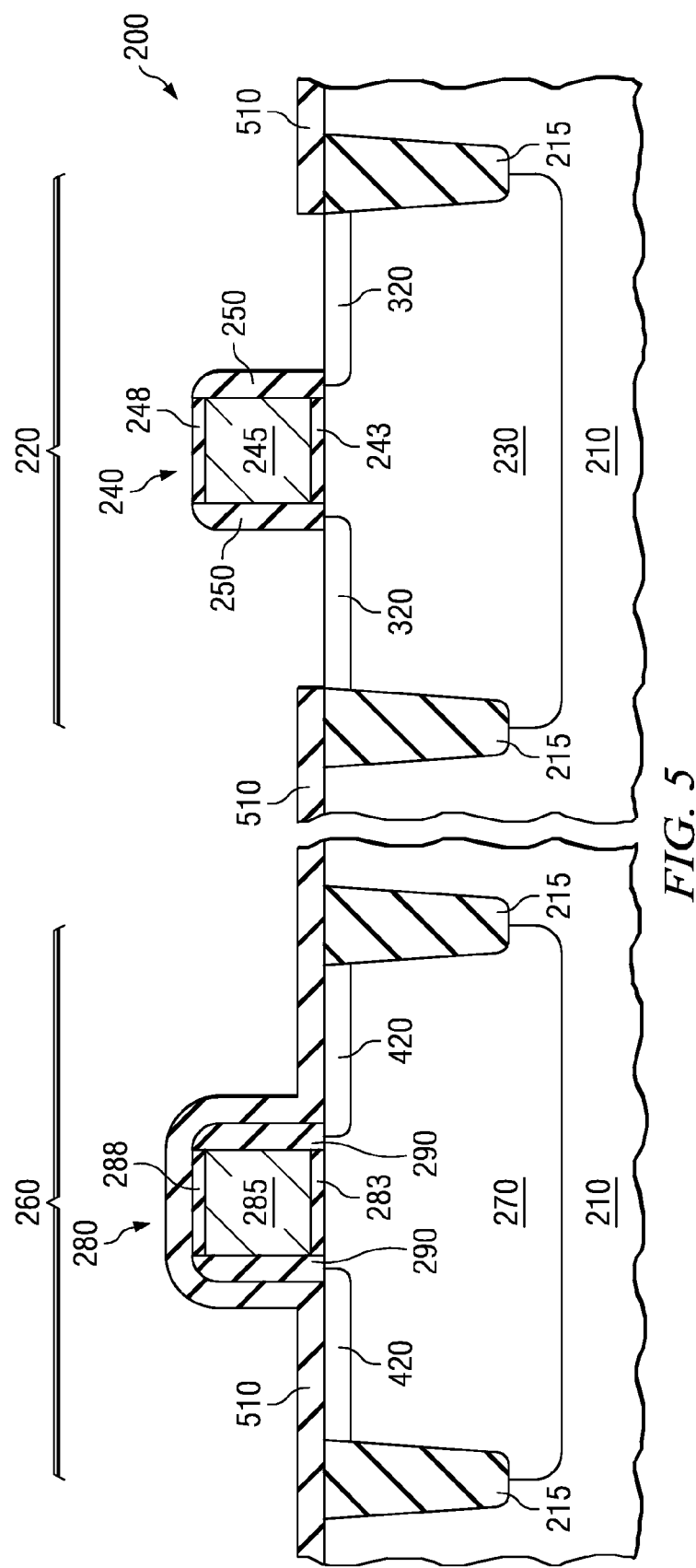

FIG. 5 illustrates the device 200 of FIG. 4 after patterning a masking layer 510 to expose at least a portion of the PMOS device region 220. The process of patterning the masking layer 510 would generally begin by depositing a conformal layer of masking material over the substrate 210. The layer of masking material, in this embodiment, may comprise an insulative material, such as SiO$_2$, SiN, or a combination thereof. In one specific embodiment, however, the layer of masking material comprises a first layer of oxide (SiO$_2$) and a layer of nitride (SiN). However, a second layer of oxide may be used over the nitride layer. As an example, the first oxide layer may have a thickness ranging from about 1.5 nm to about 10 nm, the layer of nitride may have a thickness ranging from about 2.0 nm to about 15 nm, and the optional second layer of oxide may have thickness ranging from about 1.0 nm to about 10 nm. Any suitable Chemical Vapor Deposition ("CVD") or furnace-based machine may be used to form the layer of masking material.

Thereafter, a lithography process (e.g., similar to the process described above) could be used to pattern the masking layer 510. For example, a patterned resist layer and an appropriate etch could be used to pattern the masking layer 510, thus exposing the substrate 210 in at least a portion of the PMOS device region 220 of the device 200.

Figure 6:
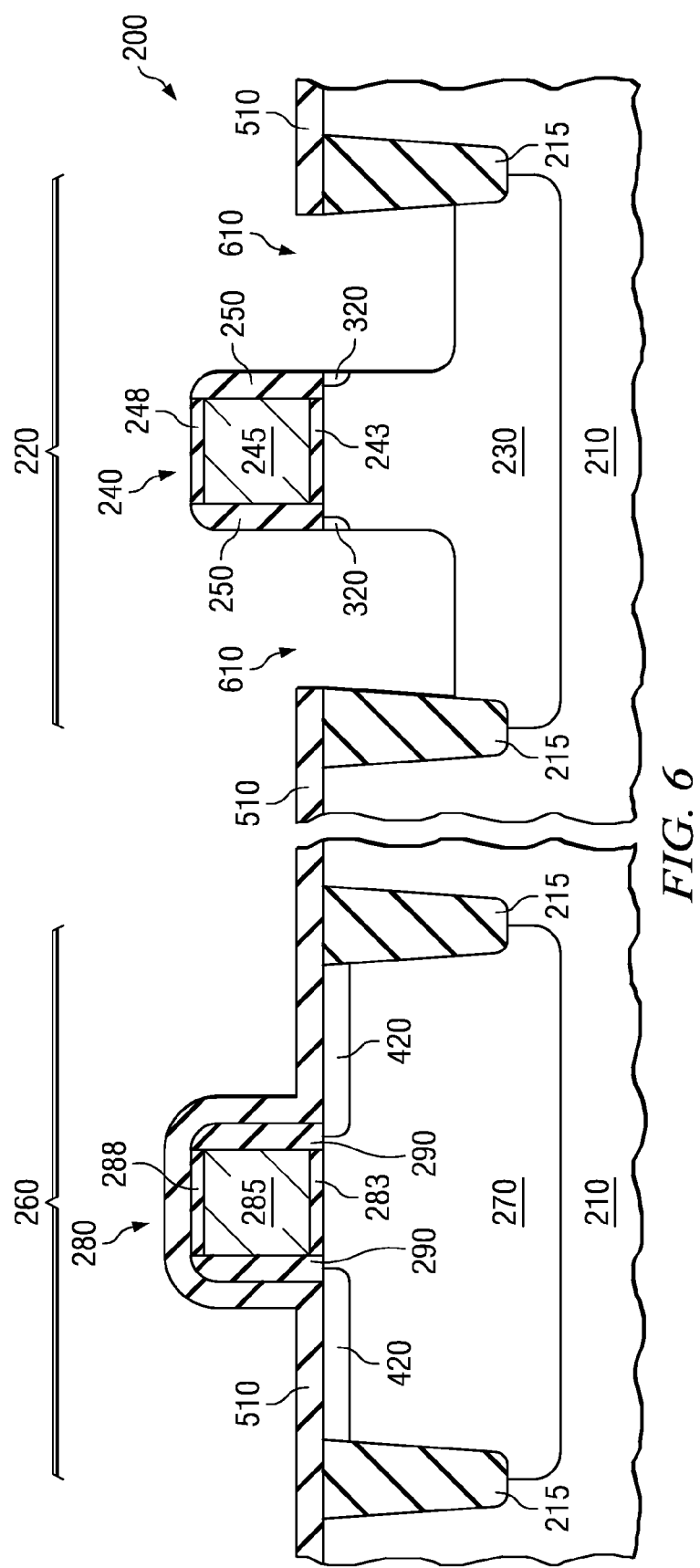

FIG. 6 illustrates the device 200 of FIG. 5 after using the patterned masking layer 510 to form recesses 610 within the substrate 210. The process of etching the recesses 610 may be conventional or not. In one embodiment, a standard silicon etch is used. For example, the etch may be a "box silicon etch", as shown in FIG. 6. In this embodiment, an anisotropic etch would be used. Because of the anisotropic nature of this etch, the recesses 610 formed by the etch shouldn't cause an excessive removal of the extension implants 320. Alternatively, an isotropic etch or combination of isotropic and anisotropic etch could be used. In this embodiment, the isotropic component will generally undercut portions of the silicon, thereby creating recesses 610 that encroach closer to the channel region and remove more material in the extension implants 320 (thus creating a corresponding change in the dosing level of those extension regions).

It is also within the scope of the disclosure to etch the recesses 610 to any suitable depth. In the example application, the recesses 610 are etched to a depth between about 10 nm and about 60 nm. Additionally, the depth of the recesses 610 may be approximately the same depth as the subsequently formed source/drain implants 920 (see FIG. 9). Moreover, as shown, the recess etch is "selective" to the masking layer 510 as well as the gate hardmask 248. Therefore, the masking layer 510 protects the NMOS device region 260 from the recess etch and the gate hardmask 248 protects the gate electrode 245 in the PMOS device region 220 from the recess etch.

Figure 7:
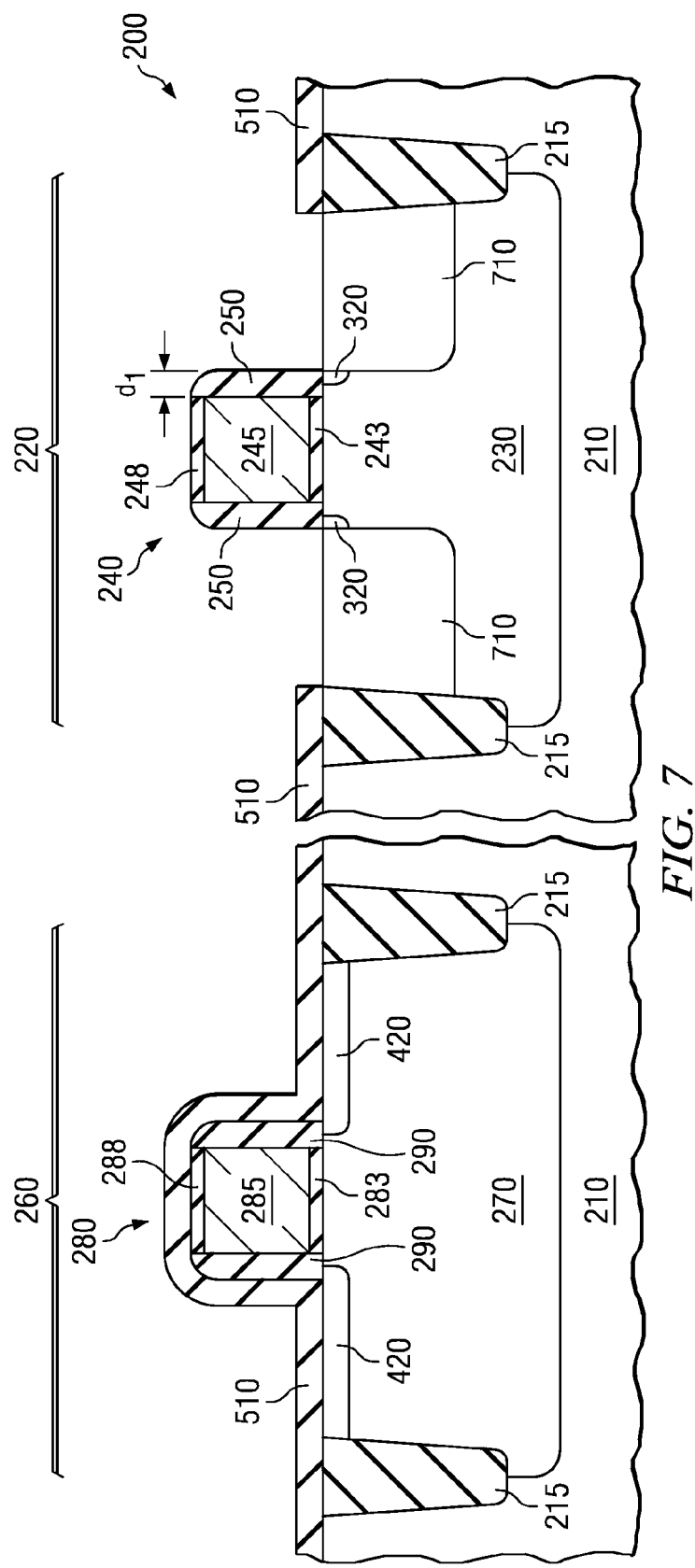

FIG. 7 illustrates the device 200 of FIG. 6 after forming silicon germanium within the recesses 610 to form recessed epitaxial silicon germanium (SiGe) regions 710. In one embodiment, the SiGe regions 710 are considered selective recessed SiGe regions because the silicon germanium is selectively deposited on the active silicon substrate 210 but not on any amorphous regions, such as the regions containing SiO$_2$ or Si$_3$N$_4$. In addition, the SiGe regions 710 may be doped or undoped. In the example application, the SiGe regions 710 are doped with a P-type dopant, for example boron. Additionally, the SiGe regions 710 may be located a distance (d$_1$) from a sidewall of the gate structure 240. In this embodiment, a thickness of the gate sidewall spacers 250 helps define this distance (d$_1$).

It is within the scope of the embodiment to use any suitable process to form the SiGe regions 710. For example, reduced-temperature chemical vapor deposition ("RTCVD"), ultra-high vacuum chemical vapor deposition ("UHCVD"), molecular beam epitaxy ("MBE"), or a small or large batch furnace-based process may be used. In the example application, a RTCVD process is used to form the SiGe regions 710. The example RTCVD process uses a temperature range of about 450° C. to about 800° C. and a pressure between about 1 Torr and about 100 Torr. In addition, the RTCVD uses the silicon-bearing precursor DCS (dichlorosilane), the germanium-bearing precursor GeH$_4$ (germane), and the p-doping precursor B$_2$H$_6$ (diborane). Process selectivity is achieved by including HCl (hydrochloric acid) and the carrier gas H$_2$ (hydrogen).

While not shown in FIG. 7, the epi process may cause the SiGe regions 710 to extend above the top surface of the substrate 210. For example, the epi process not only back-fills the recesses 610, it also continues to grow to a height somewhere above the surface of the substrate 210. Forming the SiGe regions 710 thicker than the recesses 610 can mitigate damage thereto during subsequent removal processes.

As is illustrated in FIG. 7, the masking layer 510 protects the NMOS device region 260 and the gate hardmask 248 protects the gate electrode 245 in the PMOS device region 220 from the formation of the SiGe regions 710. It is to be noted that a resist layer should generally not be used in place of the masking layer 510 and the gate hardmask 248 because resist cannot typically withstand the high temperatures that are used for the formation of the SiGe regions 710. In addition, resist is comprised of organic material that could contaminate the machinery used in the epi process.

Figure 8:
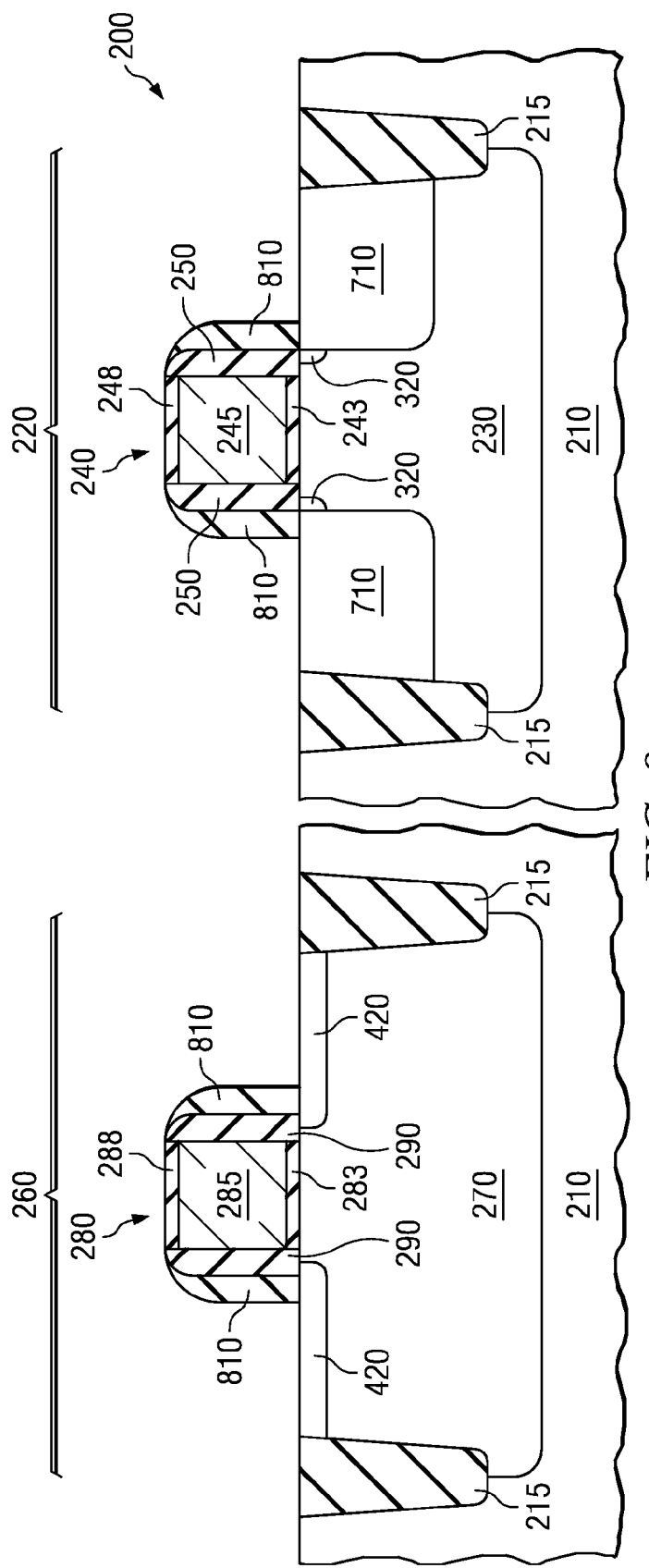

FIG. 8 illustrates the device 200 of FIG. 7 after removing the masking layer 510 and subsequent formation of source/drain spacers 810. Those skilled in the art understand the myriad of processes that might be used to remove the masking layer 510. For instance, many different processes might be used based on the type of material that the masking layer 510 comprises. In the example embodiment wherein the masking layer 510 comprises a first oxide material and a second nitride material, the second nitride material might be removed using a wet etch (e.g., a phosphoric acid strip) and the first oxide material might be removed using a HF wet etch. If the masking layer 510 were to comprise a different material or materials, another suitable etch would be used.

The source/drain spacers 810, as illustrated, may be located on opposing sides of the gate structure 240 and the gate structure 280. For example, as shown, the source/drain spacers 810 may be located directly on the gate sidewall spacers 250, 290. Other configurations, however, could be used.

The source/drain spacers 810 may be formed using many different processes. In one embodiment, however, the source/drain spacers 810 comprise a nitride and are formed using a chemical vapor deposition (CVD) process. For example, a conformal layer of nitride may be formed over the entire substrate 210. Thereafter, the conformal layer of nitride may be subjected to an anisotropic etch, in this embodiment resulting in the source/drain spacers 810. Other embodiments exist wherein the source/drain spacers 810 comprise a different material and are formed using a different suitable process.

Figure 9:
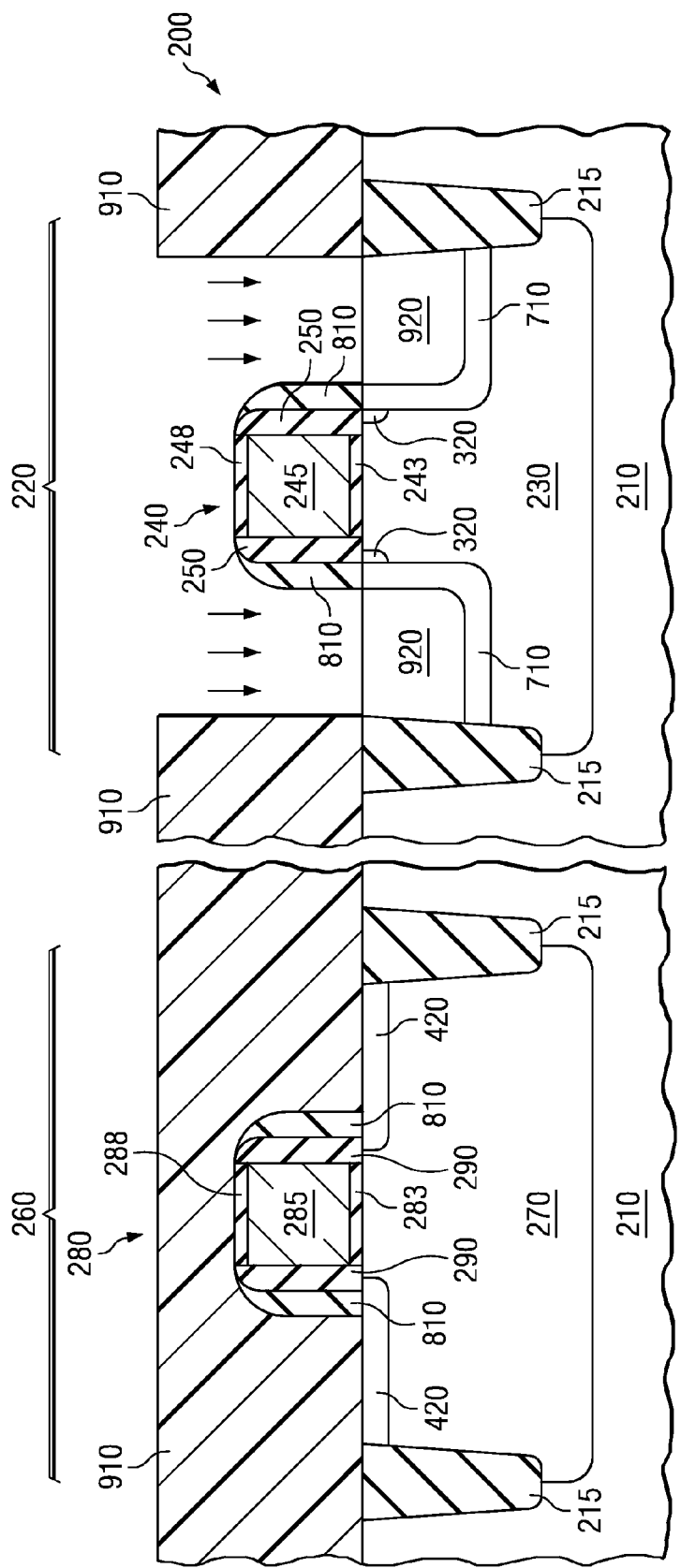

FIG. 9 illustrates the device 200 of FIG. 8 after patterning a resist layer 910 to expose the PMOS device region 220, and thereafter forming first source/drain implants 920 in the substrate 210. The patterned resist layer 910, in the example embodiment, exposes the PMOS device region 220 while protecting the NMOS device region 260. The patterned resist layer 910 may be similar in material and manufacture to the previously described patterned resist layers 310, 410.

The patterned resist layer 910, as well as the source/drain spacers 810 in this embodiment, may then be used to position the source/drain implants 920. In the illustrative embodiment, the source/drain implants 920 are located in at least a portion of the SiGe regions 710. While not shown, one example embodiment has the source/drain implants 920 extending substantially to a bottom surface of the SiGe regions 710.

The source/drain implants 920 may be conventionally formed. Generally, the source/drain implants 920 have a peak dopant concentration ranging from about 1E18 atoms/cm$^3$ to about 1E21 atoms/cm$^3$. Also, the source/drain implants 920 typically have a dopant type opposite to that of the well region 230 they are located within. Accordingly, in the embodiment shown in FIG. 9, the source/drain implants 920 are doped with a P-type dopant.

Figure 10:
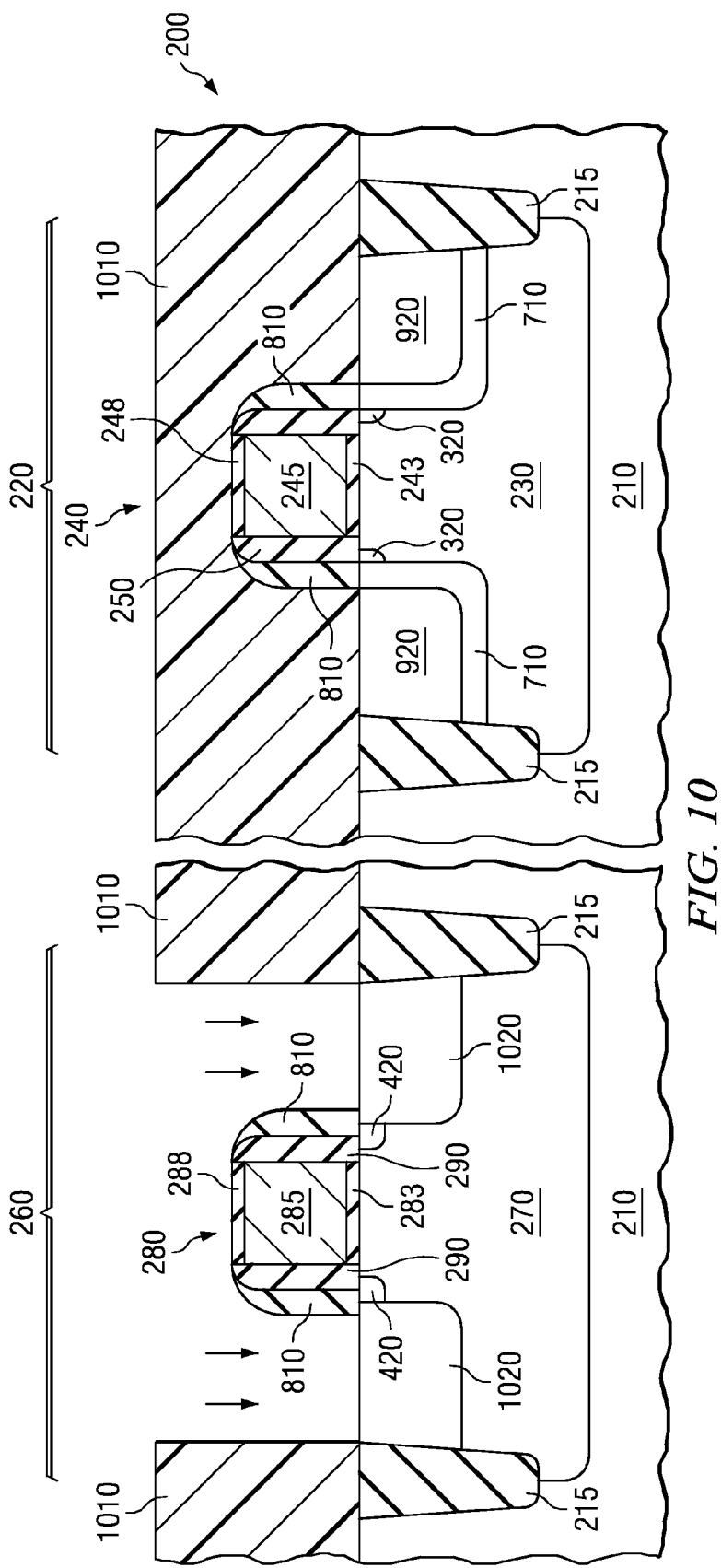

FIG. 10 illustrates the device 200 of FIG. 9 after removing the patterned resist layer 910, patterning a resist layer 1010 to expose the NMOS device region 260, and thereafter forming second source/drain implants 1020 in the substrate 210. The patterned resist layer 1010, in the example embodiment, exposes the NMOS device region 260 while protecting the PMOS device region 220. The patterned resist layer 1010 may be similar in material and manufacture to the previously described patterned resist layers 310, 410, 910.

The patterned resist layer 1010, as well as the gate structure 280 in this embodiment, may then be used to form the source/drain implants 1020 in the substrate 210. The source/drain implants 1020 may be conventionally formed. Generally, the source/drain implants 1020 have a peak dopant concentration ranging from about 1E18 atoms/cm$^3$ to about 1E21 atoms/cm$^3$. Also, the source/drain implants 1020 typically have a dopant type opposite to that of the well region 270 they are located within. Accordingly, in the embodiment shown in FIG. 10, the source/drain implants 1020 are doped with an N-type dopant.

Figure 11:
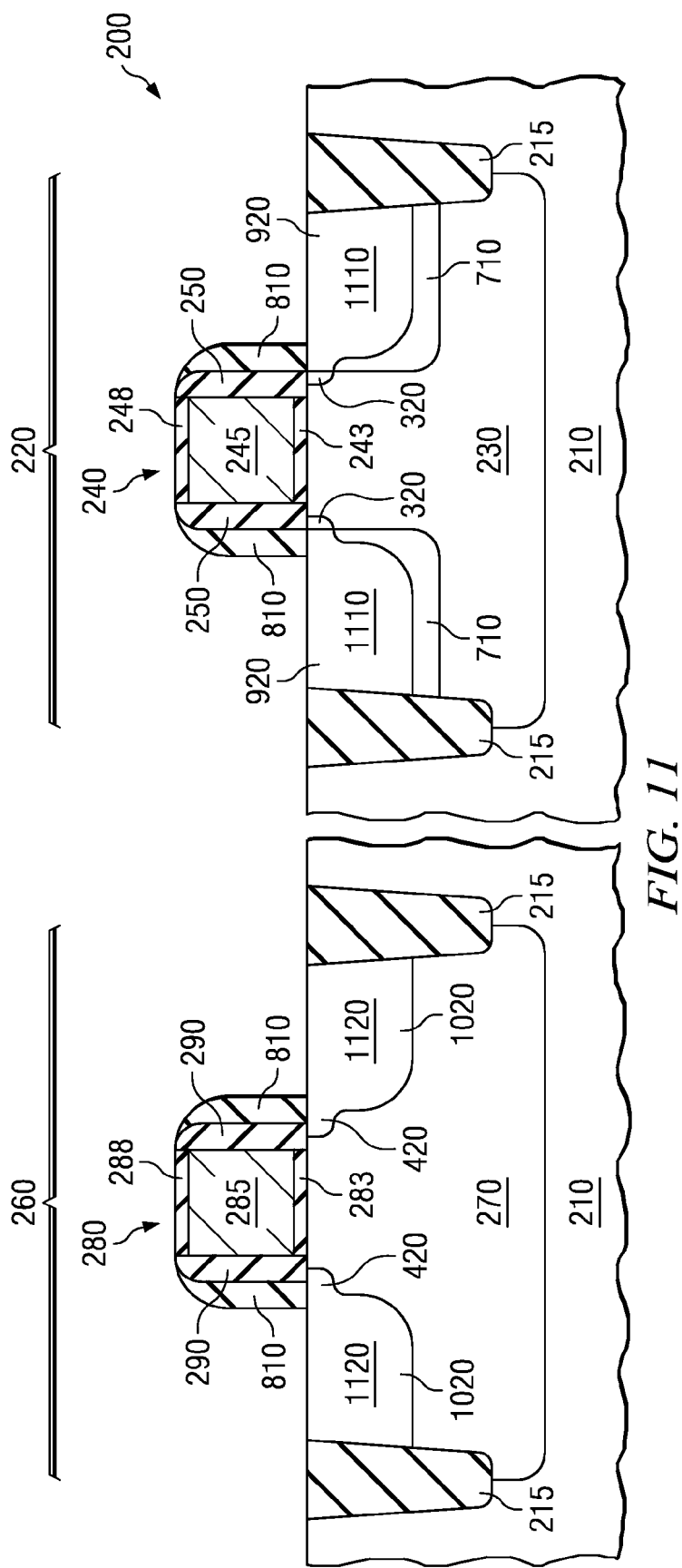

FIG. 11 illustrates the device 200 of FIG. 10 after being subjected to a thermal anneal process. In one example embodiment, the device 200 is subjected to a thermal anneal at a temperature of greater than about 800° C. for a time period ranging from about 1 seconds (Spike anneal) to about 120 seconds. However, in an alternative embodiment, the device 200 is subjected to a flash anneal or laser anneal at other suitable temperatures. What generally results are activated source/drain regions 1110 in the PMOS device region 220 and activated source/drain regions 1120 in the NMOS device region 260.

Figure 12:
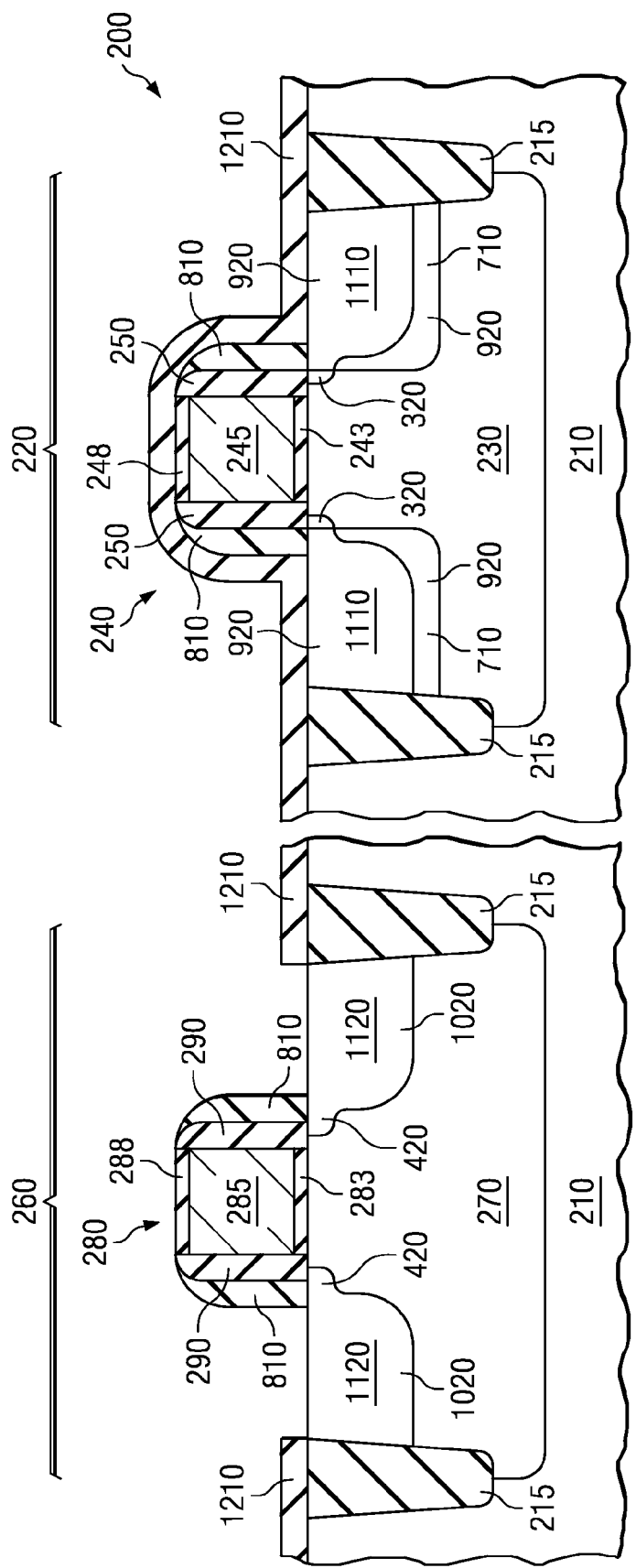

FIG. 12 illustrates the device 200 of FIG. 11 after patterning a masking layer 1210 to expose at least a portion of the NMOS device region 260. The masking layer 1210 in the example embodiment exposes at least a portion of the NMOS device region 260 while protecting the PMOS device region 220. The process of patterning the masking layer 1210 would typically be similar to the process of patterning the masking layer 510, except for the difference in location. Thus, no further detail is needed.

Figure 13:
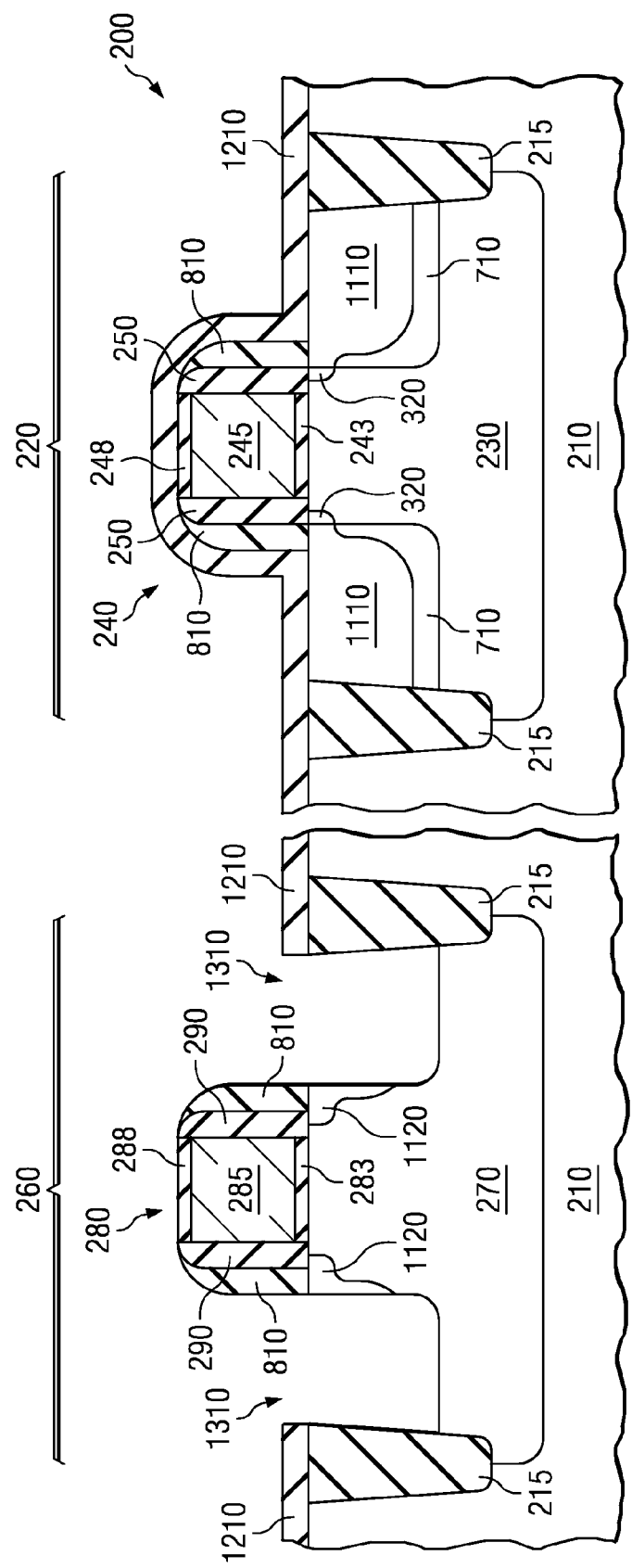

FIG. 13 illustrates the device 200 of FIG. 12 after using the patterned masking layer 1210 to form recesses 1310 within the substrate 210. The process of etching the recesses 1310 may be conventional or not, and in one embodiment may be similar to the above-described process for etching the recesses 610. It is within the scope of the disclosure to etch the recesses 1310 to any suitable depth, including a depth between about 10 nm and about 60 nm. Additionally, the depth of the recesses 1310 could be the same depth as the source/drain implants 1020 (see FIG. 10). Moreover, as shown, the recess etch is "selective" to the masking layer 1210 as well as the gate hardmask 288. Therefore, the masking layer 1210 protects the PMOS device region 220 from the recess etch and the gate hardmask 288 protects the gate electrode 285 in the NMOS device region 260 from the recess etch.

Figure 14:
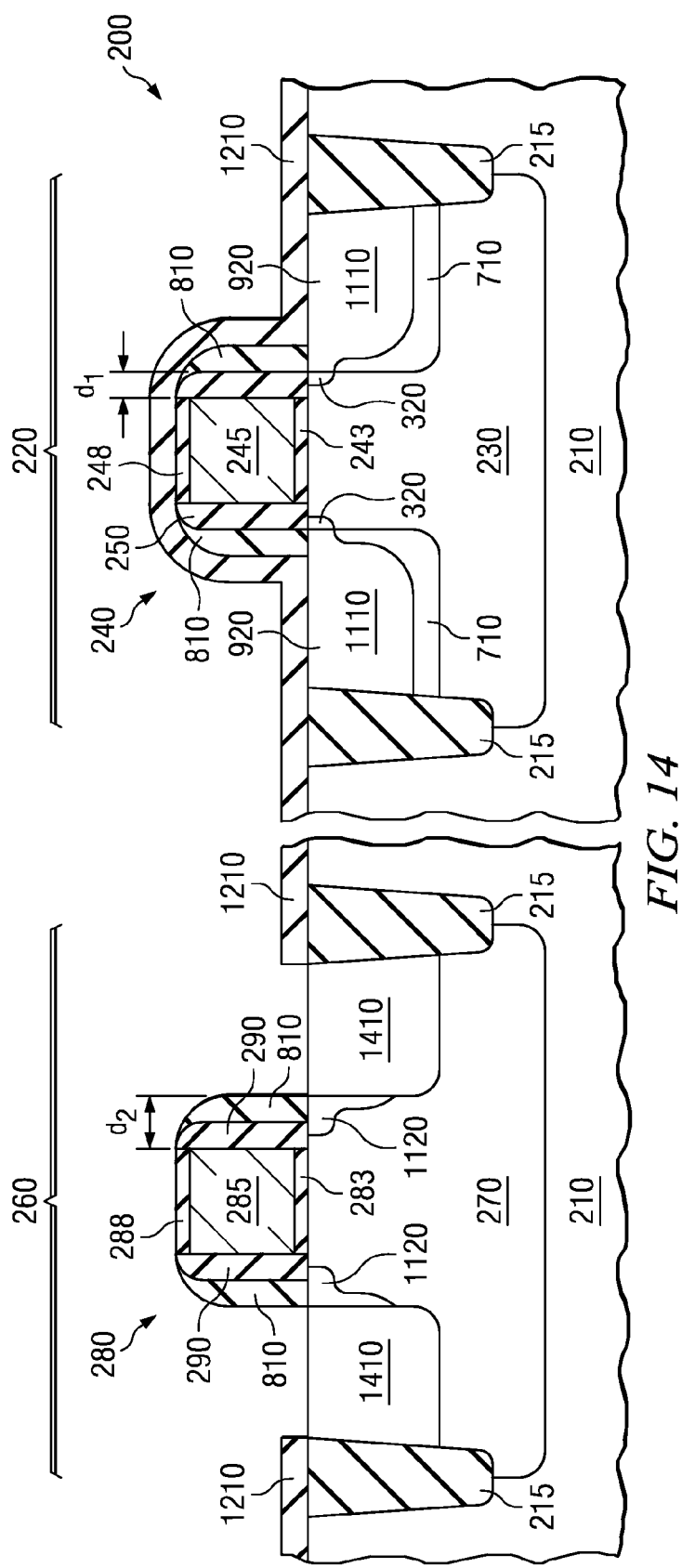

FIG. 14 illustrates the device 200 of FIG. 13 after forming carbon doped silicon within the recesses 1310 to form recessed epitaxial carbon doped silicon (SiC) regions 1410. In one embodiment, the SiC regions 1410 are considered selective recessed SiC regions because the carbon doped silicon is selectively deposited on the active silicon substrate 210 but not on any amorphous regions, such as the regions containing SiO$_2$ or Si$_3$N$_4$. In addition, the SiC regions 1410 may be doped or undoped. In the example application, the SiC regions 1410 are doped with an N-type dopant, for example phosphorous. Additionally, the SiC regions 1410 may be located a distance ($d_2$) from a sidewall of the gate structure 280. In this embodiment, a thickness of the gate sidewall spacers 290 and source/drain spacers 810 help define this distance ($d_2$). As is illustrated in the embodiment of FIG. 14, the distance ($d_2$) is greater than the distance ($d_1$). Moreover, because of the order of manufacture, the activated source/drain regions 1120 are not located within the SiC regions 1410 in the embodiment of FIG. 14.

It is within the scope of the embodiment to use any suitable process to form the SiC regions 1410. For example, RTCVD, UHCVD, MBE, or a small or large batch furnace-based process may be used. In the example application, a RTCVD process is used to form the SiC regions 1410. The example RTCVD process uses a temperature range of about 400° C. to about 750° C. and a pressure between about 1 Torr and about 100 Torr. In addition, the RTCVD uses a silicon-bearing precursor DCS (dichlorosilane), a carbon-bearing precursor, and the N-doping precursor phosphine. Process selectivity is achieved by including HCl (hydrochloric acid) and the carrier gas H$_2$ (hydrogen).

While not shown in FIG. 14, the epi process may cause the SiC regions 1410 to extend above the top surface of the substrate 210. For example, the epi process not only back-fills the recesses 1310, it also continues to grow to a height somewhere above the surface of the substrate 210. Forming the SiC regions 1410 thicker than the recesses 1310 can mitigate damage thereto during subsequent removal processes. As is illustrated in FIG. 14, the masking layer 1210 protects the PMOS device region 220 and the gate hardmask 288 protects the gate electrode 285 in the NMOS device region 260 from the formation of the SiC regions 1410.

After completing the device 200 of FIG. 14, conventional or not so conventional manufacturing processes could be used to complete the device 200. For example, the device 200 might be subjected to an optional light implant or low temperature anneal. For example, in one embodiment the device 200 will not be subjected to an RTA or furnace anneal using a temperature greater than about 1000° C. after forming the SiC regions 1410. Thus, the optional light implant or low temperature anneal should be conducted below this temperature. Additionally, the device 200 of FIG. 14 may have the gate hardmasks 248, 288 removed from the gate structures 240, 280, respectively. Moreover, the device 200 could be subjected to a silicidation and/or PMD loop. Other manufacturing steps would likely also occur.

The process flow described with respect to FIGS. 2-14 illustrates but one embodiment of the disclosure. Other embodiments also exist. For instance, in another embodiment the gate structures 240 and 280 are not doped during the formation thereof. In this embodiment, the gate structures 240 could be doped at a later processing step, including during the formation of the extension implants 320, 420, or source/drain implants 920, 1020, respectively. In an even alternative embodiment, a replacement gate process is used. In this embodiment the gate hardmasks 248, 248 and gate electrodes 245, 285, as well as the gate dielectrics 243, 283 in an optional step, may be removed and replaced with a metal or high dielectric constant gate flow. Additionally, the order of manufacturing many of the features of FIGS. 2-14, with the exception of the SiC regions 1020, could be reordered.

FIGS. 15-22 illustrate another example process flow for manufacturing a semiconductor device in accordance with the disclosure. The embodiment of FIGS. 15-22 is somewhat similar to the embodiment of FIGS. 2-14. Accordingly, like reference numerals are being used to indicate similar features. In these situations, similar processing steps might be used to manufacture the similar features.

Figure 15:
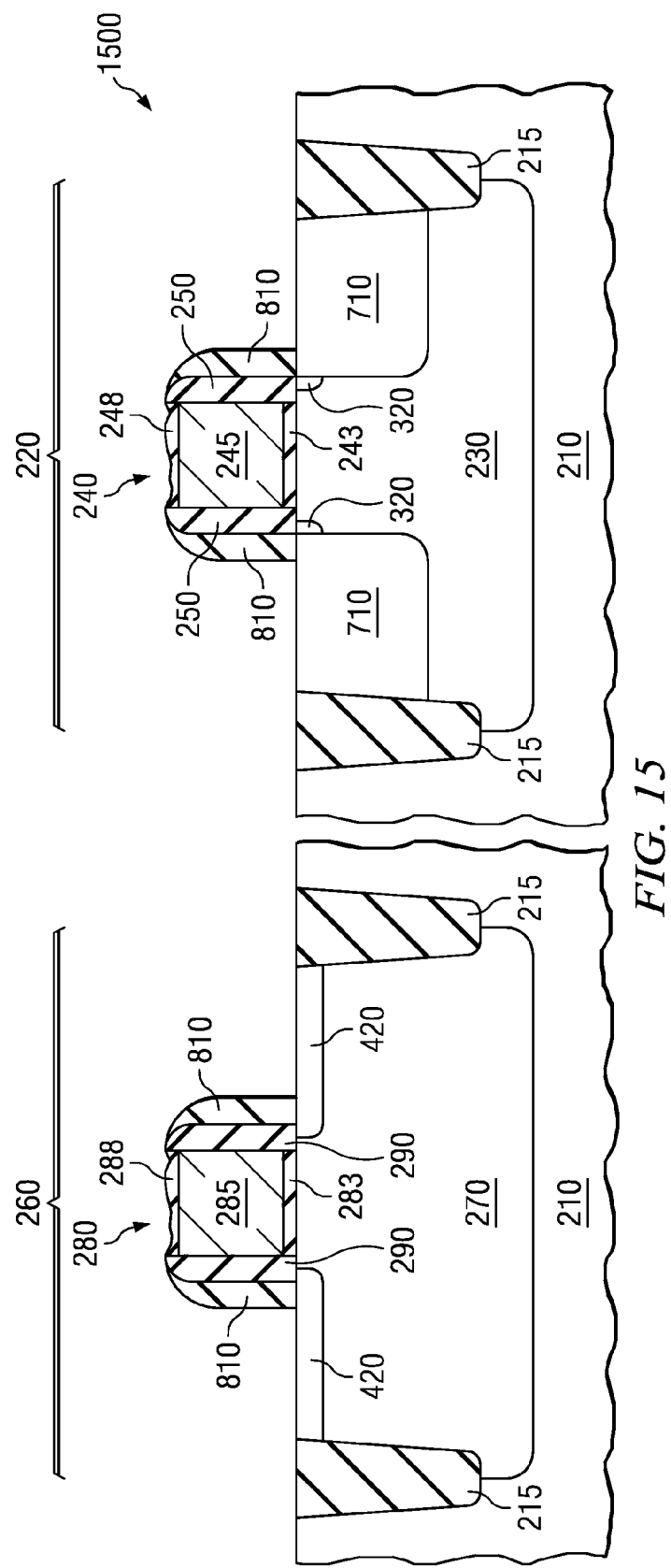
FIGS. 15-22 illustrate steps of another example embodiment for manufacturing a semiconductor device in accordance with this disclosure.

The device 1500 of FIG. 15 is substantially similar to the device 200 of FIG. 8. However, in the embodiment of FIG. 15 the gate hardmasks 248, 288 have been intentionally roughed up during the formation of the source/drain spacers 810. For instance, the source/drain spacers 810 could be over etched to an extent that they rough up the gate hardmasks 248, 288, as shown. The roughening up of the gate hardmasks 248, 288 attempts to remove enough thereof such that they can be easily removed in a subsequent step.

Figure 16:
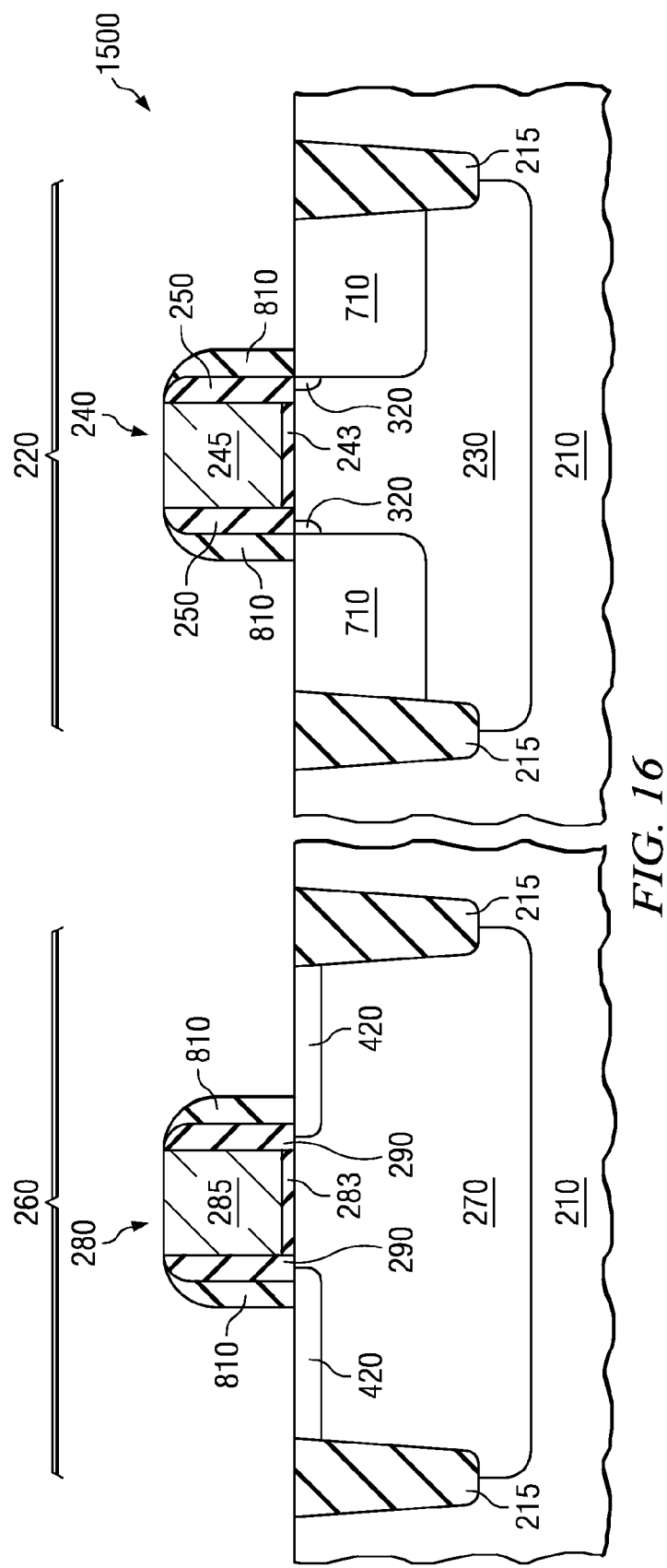

FIG. 16 illustrates the device 1500 of FIG. 15 after removing the roughed up gate hardmasks 248, 288. In the embodiment wherein the gate hardmask 248, 288 comprise a nitride, a hot phosphoric acid strip could be used to remove the gate hardmasks 248, 288. If the gate hardmasks 248, 288 were to comprise a different material, another suitable removal process could be used.

Figure 17:
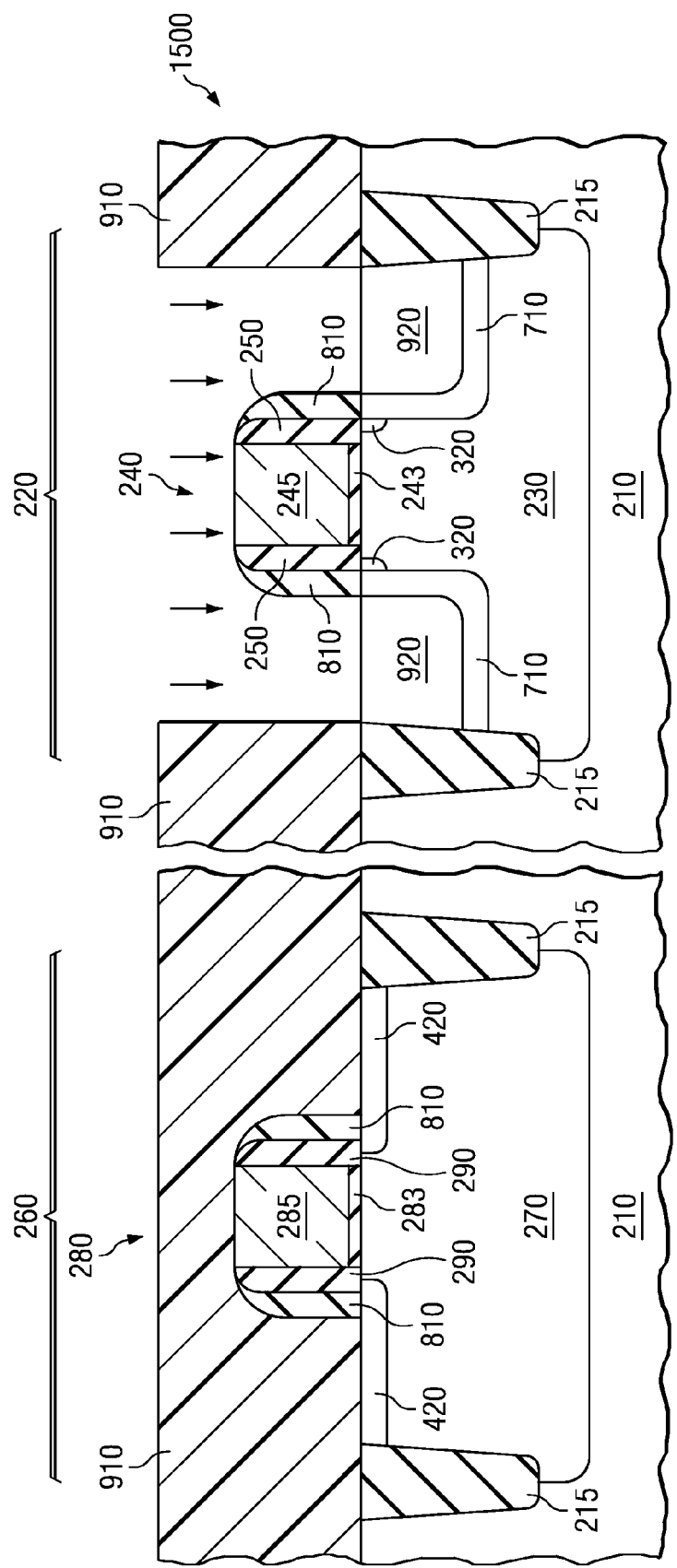

FIG. 17 illustrates the device 1500 of FIG. 16 after forming source/drain implants 920 within the substrate 210 in the PMOS device region 220. However, as opposed to that shown in FIG. 9, the implantation of the source/drain implants 920 of FIG. 17 is also doping the gate electrode 245. Accordingly, the gate electrode 245 of FIG. 17 is doped during the formation of the source/drain implants 920.

Figure 18:
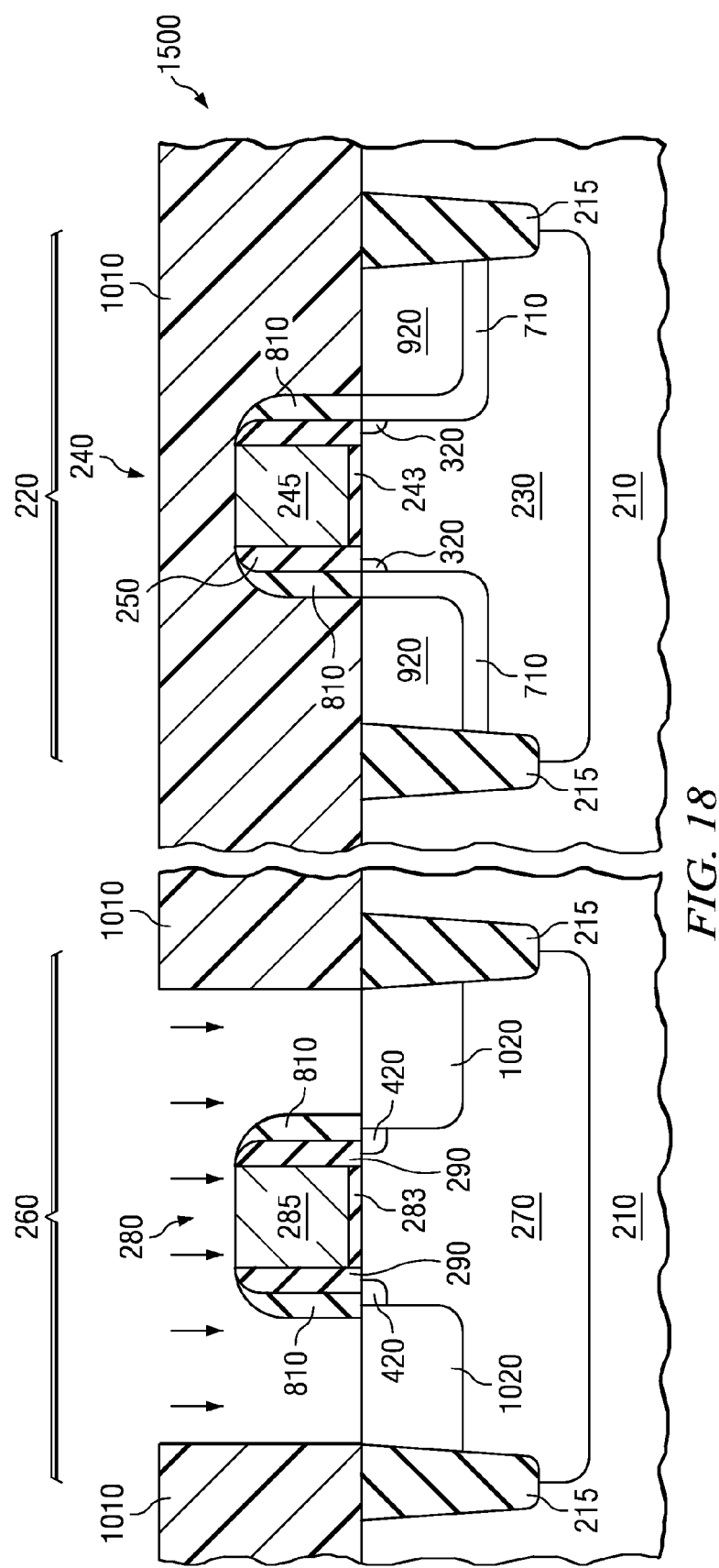

FIG. 18 illustrates the device 1500 of FIG. 17 after forming source/drain implants 1020 within the substrate 210 in the NMOS device region 260. However, as opposed to that shown in FIG. 10, the implantation of the source/drain implants 1020 of FIG. 18 is also doping the gate electrode 285. Accordingly, the gate electrode 285 of FIG. 18 is doped during the formation of the source/drain implants 1020.

Figure 19:
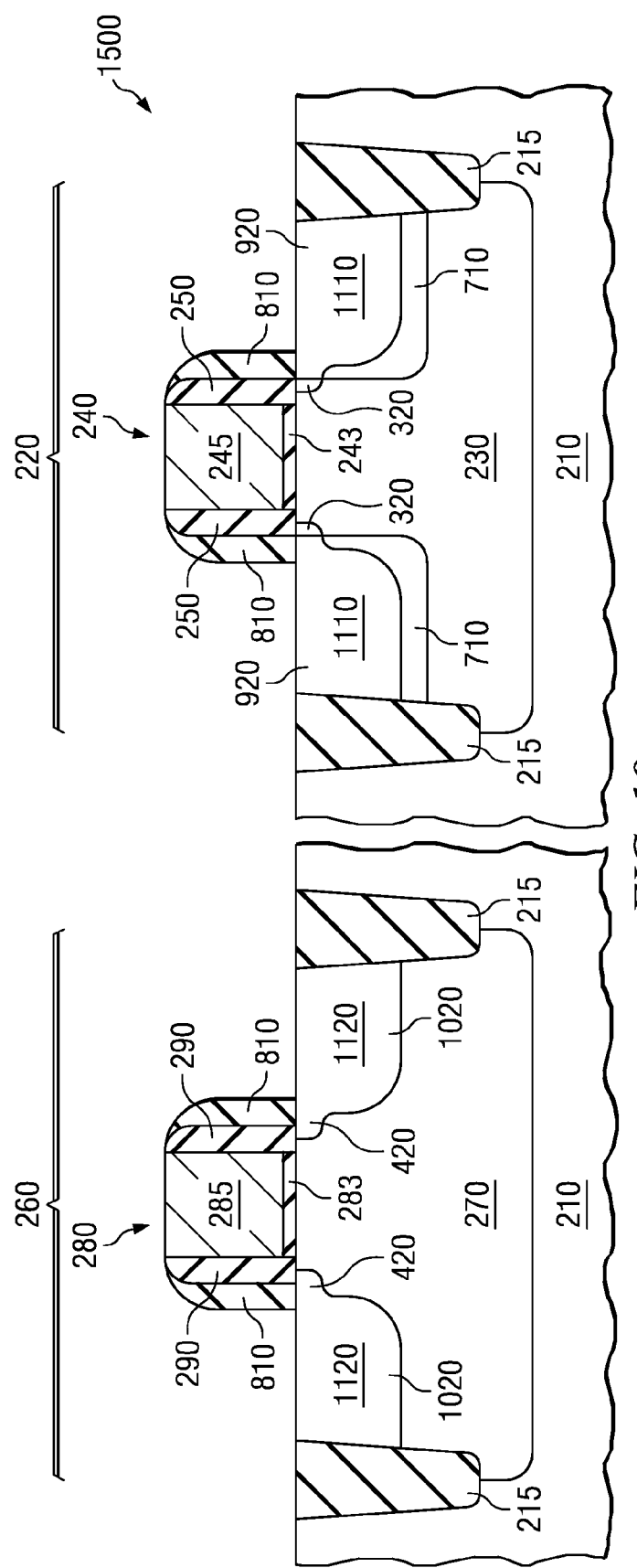

FIG. 19 illustrates the device 1500 of FIG. 18 after subjecting it to a thermal anneal process to form the activated source/drain regions 1110, 1120. The only significant difference between the device 200 of FIG. 11 and the device 1500 of FIG. 19 is the existence (and lack of existence) of the gate hardmasks 248, 288 in FIG. 11.

Figure 20:
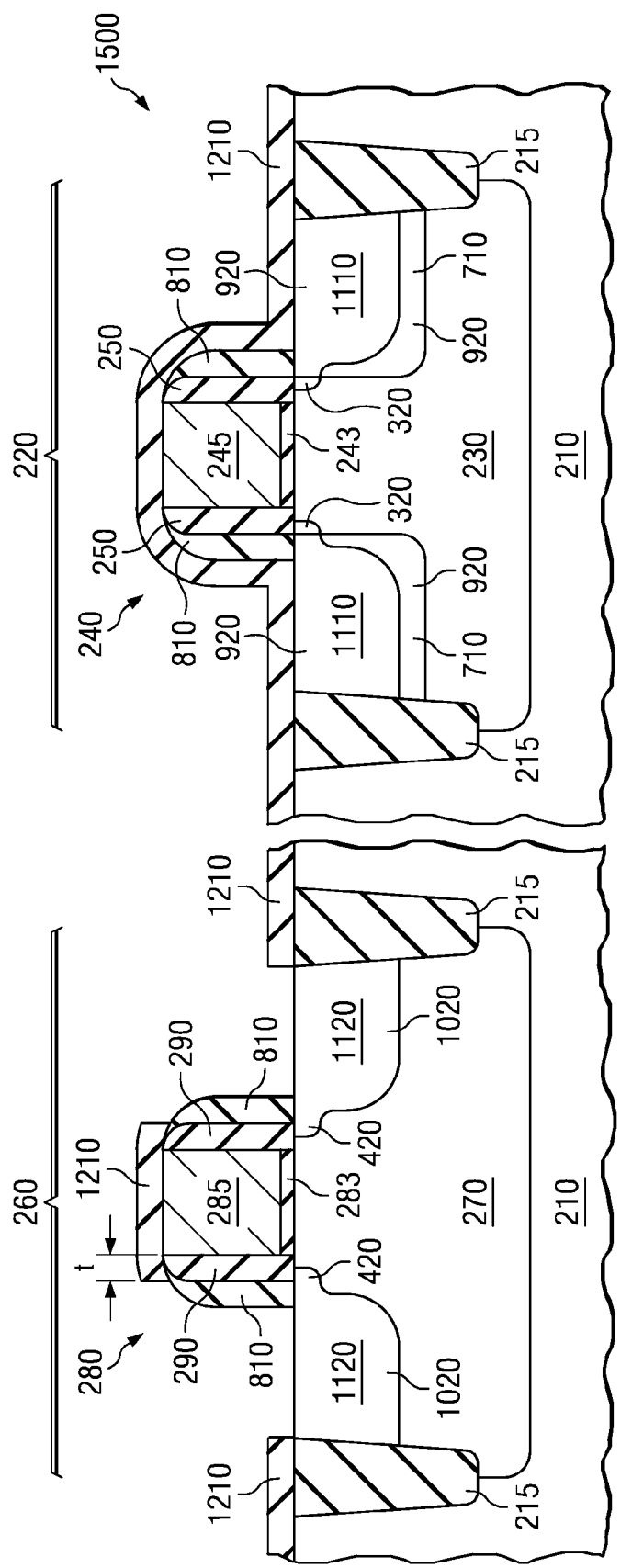

FIG. 20 illustrates the device 1500 of FIG. 19 after patterning a masking layer 1210 exposing at least a portion of the NMOS device region 260 and protecting the PMOS device region 220. The only significant difference between the device 200 of FIG. 12 and the device 1500 of FIG. 20 is the fact that the patterned masking layer 1210 remains over at least a portion of the gate structure 280 in the embodiment of FIG. 20. For instance, because the gate hardmask 288 no longer exists to protect the gate electrode 285, the masking layer 1210 is patterned to protect the gate electrode 285. In the embodiment of FIG. 20, the masking layer 1210 protects all of the PMOS device region 220 and the gate structure 280 plus a small alignment tolerance (t). In the example embodiment shown, the masking layer 1210 has an alignment tolerance (t) ranging from about 10 nm to about 20 nm.

Figure 21:
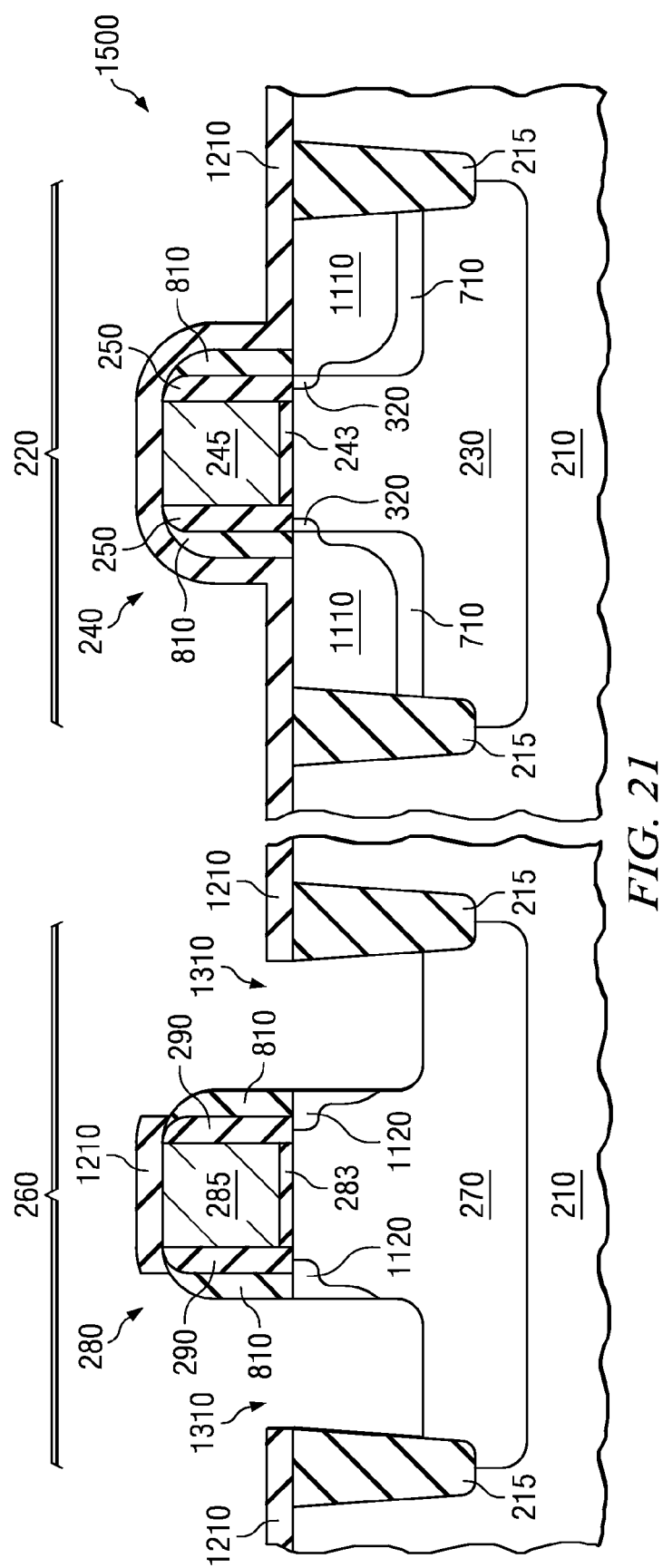

FIG. 21 illustrates the device 1500 of FIG. 20 after forming recesses 1310. In the embodiment shown, the gate electrode 285 is protected from the recess etch by the patterned masking layer 1210.

Figure 22:
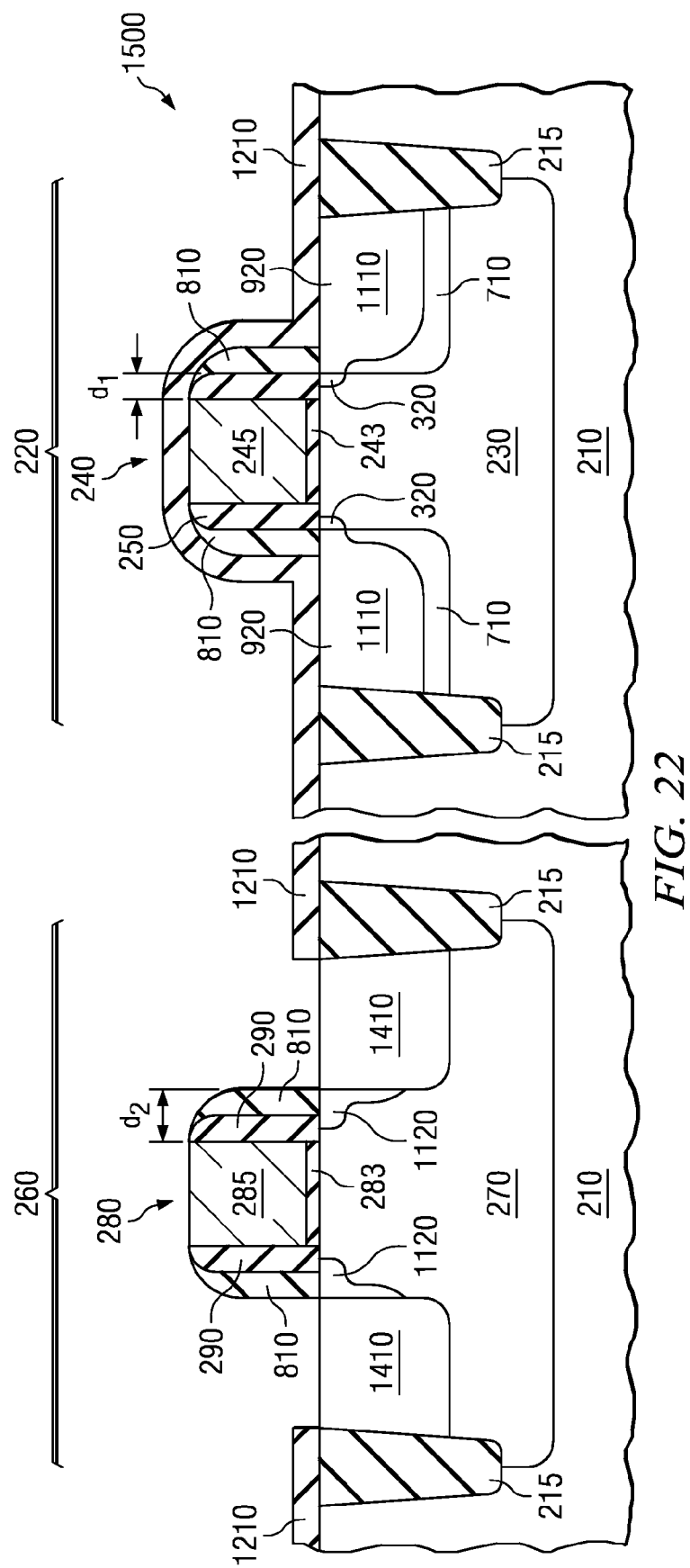

FIG. 22 illustrates the device 1500 of FIG. 21 after forming recessed SiC regions 1410 within the recesses 1310 of FIG. 21. Again, in the embodiment shown the gate electrode 285 is protected from the growth of the SiC regions 1410 by the patterned masking layer 1210. The device 1500 of FIG. 22 is ultimately substantially similar to the device 200 of FIG. 14.

Figure 23:
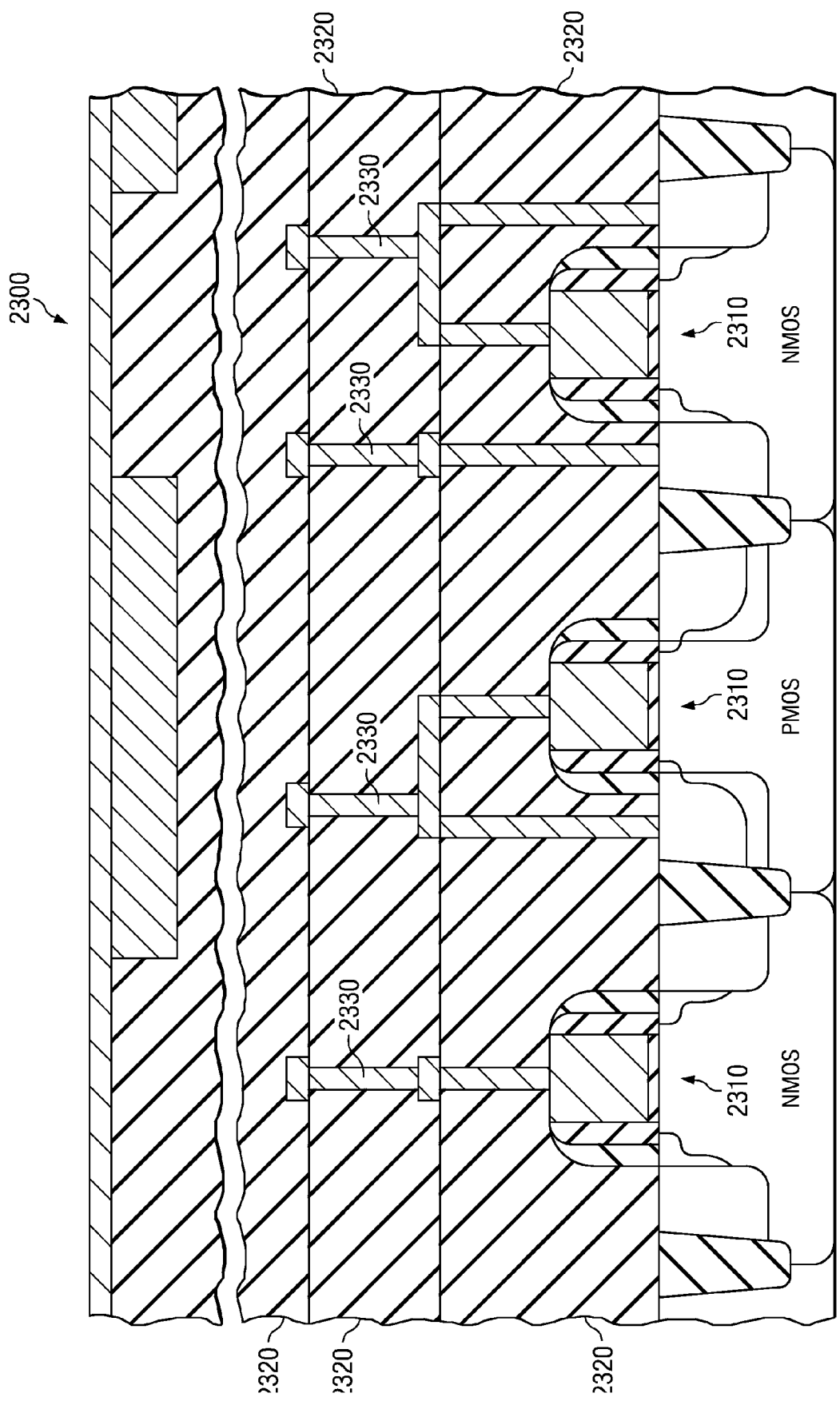
FIG. 23 illustrates an integrated circuit (IC) having been manufactured using one embodiment of the disclosure.

FIG. 23 illustrates an integrated circuit (IC) 2300 having been manufactured using one embodiment of the disclosure. The IC 2300 may include devices, such as transistors used to form CMOS devices, BiCMOS devices, Bipolar devices, as well as capacitors or other types of devices. The IC 2300 may further include passive devices, such as inductors or resistors, or it may also include optical devices or optoelectronic devices. Those skilled in the art are familiar with these various types of devices and their manufacture. In the particular embodiment illustrated in FIG. 23, the IC 2300 includes devices 2310, which in this embodiment are NMOS devices and PMOS devices. For instance, in one embodiment the NMOS devices and PMOS devices illustrated in FIG. 23 are manufactured using similar processes as described above with respect to FIGS. 2-14 or FIGS. 15-22. Located over the devices 2310 are interlevel dielectric layers 2320. Located within the interlevel dielectric layers 2320 and contacting the devices 2310 are interconnects 2330. The resulting IC 2300 is optimally configured as an operational integrated circuit.

The phrase "providing a substrate", as used herein, means that the substrate may be obtained from a party having already manufactured it, or alternatively may mean manufacturing the substrate themselves and providing it for its intended purpose.

Those skilled in the art to which the invention relates will appreciate that additions, deletions, substitutions and modifications may be made to the described embodiments without departing from the scope of the claimed invention.

What is claimed is:

1. A method for manufacturing a semiconductor device, comprising:
   providing a substrate having a P-type metal oxide semiconductor (PMOS) device region and an N-type metal oxide semiconductor (NMOS) device region;
   forming a first gate structure over the substrate in the PMOS device region and a second gate structure over the substrate in the NMOS device region;
   forming recessed epitaxial silicon germanium regions in the substrate in the PMOS device region on opposing sides of the first gate structure;
   forming first source/drain regions including first source/drain implants in the recessed epitaxial silicon germanium regions on opposing sides of the first gate structure, and forming second source/drain regions including second source/drain implants on opposing sides of the second gate structure;
   annealing the first source/drain regions and the second source/drain regions including annealing the first source/drain implants and the second source/drain implants to form activated first source/drain regions and activated second source/drain regions; and after the annealing, forming recessed epitaxial carbon doped silicon regions in the substrate in the NMOS device region on opposing sides of the second gate structure, wherein the recessed epitaxial carbon doped silicon regions replace portions of the activated second source/drain regions, and other portions of the activated second source/drain regions remain which are not located within the recessed epitaxial carbon doped silicon regions.

2. The method of claim 1, wherein forming the first source/drain regions includes first extension implants; wherein forming the second source/drain regions includes second extension implants; wherein annealing the first source/drain regions includes annealing the first extension implants; and wherein annealing the second source/drain regions includes annealing the second extension implants.

3. The method of claim 1, wherein the epitaxial carbon doped silicon regions are doped with phosphorous.

4. The method of claim 1, wherein the recessed epitaxial silicon germanium regions are located a distance ($d_1$) from sidewalls of the first gate structure and further wherein the recessed epitaxial carbon doped silicon regions are located a greater distance ($d_2$) from sidewalls of the second gate structure; wherein the distance ($d_1$) is related to a thickness of gate sidewall spacers; and wherein the greater distance ($d_2$) is related to a thickness of the gate sidewall spacers and source/drain spacers.

5. The method of claim 1, wherein forming the recessed epitaxial silicon germanium regions includes forming a masking layer protecting the NMOS device region and exposing at least a portion of the PMOS device region, subjecting exposed portions of the PMOS device region to an etch to form first recesses, and growing epitaxial silicon germanium within the first recesses; and wherein forming the recessed epitaxial carbon doped silicon regions includes forming the masking layer protecting the PMOS device region and exposing at least a portion of the NMOS device region, subjecting exposed portions of the NMOS device region to an etch to form second recesses, and growing epitaxial carbon doped silicon within the second recesses.

6. The method of claim 1, further including forming interlevel dielectric layers over the first gate structure and the second gate structure, wherein the interlevel dielectric layers include interconnects therein for respectively contacting the first gate structure and the second gate structure.

7. The method of claim 1, further comprising forming first sidewall spacers on sidewalls of the first gate structure; and wherein the recessed epitaxial silicon germanium regions are formed in locations on opposing sides of the first gate structure laterally offset from the sidewalls using at least a portion of the first sidewall spacers.

8. The method of claim 7, wherein the recessed epitaxial silicon germanium regions are formed to have substantially vertical sidewalls.

9. The method of claim 7, further comprising forming second sidewall spacers on sidewalls of the second gate structure; and wherein the carbon doped silicon regions are formed in locations on opposing sides of the second gate structure laterally offset from the sidewalls using at least a portion of the second sidewall spacers.

10. The method of claim 9, wherein forming the first sidewall spacers includes forming the first sidewall spacers also as first sidewall spacers on the sidewalls of the second gate structure; and forming the second sidewall spacers comprises forming the second sidewall spacers over the first sidewall spacers.

11. The method of claim 10, wherein the silicon germanium regions are laterally offset by the first sidewall spacers from the sidewalls of the first gate structure; and wherein the silicon carbon regions are laterally offset by the first sidewall spacers and the second sidewall spacers from the second gate structure.

12. The method of claim 11, wherein the silicon germanium regions have substantially vertical sidewalls.

13. The method of claim 1, wherein forming the first source/drain regions includes first extension implants and forming the second source/drain regions includes second extension implants.

14. The method of claim 1, wherein source/drain extension regions are formed prior to the formation of the recessed silicon germanium regions.

15. The method of claim 1, wherein the recessed epitaxial silicon germanium regions are formed by etching regions of the substrate to form recesses; and forming silicon germanium within those recesses.

16. A method for manufacturing a semiconductor device, including integrating silicon germanium and carbon doped silicon within source/drain regions in a CMOS process flow, comprising:
providing a substrate having isolated PMOS and NMOS device regions;
forming a first gate structure over an N-type well region in the substrate in the PMOS device region and a second gate structure over a P-type well region in the substrate in the NMOS device region, each gate structure comprising a polysilicon gate electrode overlying a gate dielectric, and a gate hardmask overlying the polysilicon gate electrode;
forming gate sidewall spacers on opposite sides of the first and second gate structures;
forming extension implants respectively within the N-type well region and the P-type well region;
forming recesses within the N-type well region on opposing sides of the first gate structure;
forming silicon germanium epitaxially within the recesses formed within the N-type well region on the opposing sides of the first gate structure;
forming gate source/drain spacers over the gate sidewall spacers on opposite sides of the gate structures;
forming source/drain implants respectively within the epitaxially formed silicon germanium in the N-type well region and within the P-type well region;
performing at least one anneal to activate the extension implants and the source/drain implants;
after performing the at least one anneal, forming recesses with the P-type well region on opposing sides of the second gate structure, including within portions of the activated source/drain implants within the P-type well region, leaving other portions of the activated source/drain implants within the P-type well region remaining; and
forming carbon doped silicon epitaxially within the recesses formed within the P-type region on the opposing sides of the second gate structure, wherein the remaining other portions of the activated source/drain implants are not located within the epitaxially formed carbon doped silicon.

17. The method of claim 16, wherein the at least one anneal is performed at a temperature exceeding 800° C.

18. The method of claim 16, wherein forming the carbon doped silicon includes forming carbon doped silicon doped with an N-type dopant.

19. A method for manufacturing a semiconductor device, including integrating silicon germanium and carbon doped silicon within source/drain regions in a CMOS process flow, comprising:

provessproviding a substrate having isolated PMOS and NMOS device regions, a first gate structure formed over the substrate in the PMOS device region, a second gate structure formed over the substrate in the NMOS device region, and gate sidewall spacers formed on opposite sides of the first and second gate structures;

with the gate sidewall spacers in place, selectively respectively forming P-type dopant extension implants in the PMOS device region and N type dopant extension implants in the NMOS device region;

after forming the extension implants, selectively forming recesses in the PMOS device region on opposing sides of the first gate structure leaving at least part of the P-type dopant extension implants and all of the N-type dopant extension implants remaining;

depositing silicon germanium in the recesses in the PMOS device region to form recessed epitaxial silicon germanium regions on the opposing sides of the first gate structure;

after forming the recessed epitaxial silicon germanium regions, forming gate source/drain spacers over the gate sidewall spacers on opposite sides of the first and second gate structures;

with the gate source/drain spacers in place, selectively respectively forming P-type dopant source/drain implants in the recessed epitaxial silicon germanium regions in the PMOS device region and N-type dopant source/drain implants in the substrate in the NMOS device region;

after forming the source/drain implants, performing at least one anneal greater than about 800° C. to activate the remaining part of the P-type extension implants, the P-type source/drain implants, the N-type extension implants and the N-type source/drain implants;

after performing the at least one anneal, selectively forming recesses on opposing sides of the second gate structure in the NMOS device region, including in portions of the activated N-type source/drain implants, leaving other portions of the activated N-type source/drain implants remaining; and depositing carbon doped silicon in the recesses in the NMOS device region to form recessed epitaxial carbon doped silicon regions on the opposing sides of the second gate structure, wherein the activated N-type extension implants and remaining other portions of the activated N-type source/drain implants are not located within the epitaxial carbon doped silicon regions.

20. The method of claim 19, further comprising doping the deposited carbon doped silicon with an N-type dopant.

21. A method for manufacturing a semiconductor device, comprising:

providing a substrate including a PMOS device region and an NMOS device region;

forming a first gate structure, including a first gate dielectric, a first gate electrode and first gate sidewall spacers, over the substrate in the PMOS device region;

forming recessed epitaxial SiGe regions in the substrate on opposing sides of the first gate structure and offset by a second distance $d_1$ from sidewalls of the first gate electrode using the first gate sidewall spacers;

forming first source/drain spacers over the first gate sidewall spacers after forming the recessed epitaxial SiGe regions;

forming first source/drain regions on opposing sides of the first gate structure using the first gate sidewall spacers, and first source/drain spacers, at least a portion of each first source/drain region being located within at least a portion of a corresponding one of the recessed epitaxial SiGe regions;

forming a second gate structure, including a second gate dielectric, a second gate electrode, second gate sidewall spacers and second source/drain spacers, over the substrate in the NMOS device region;

forming second source/drain regions on opposing sides of the second gate structure using the second gate sidewall spacers and first source/drain spacers;

activating the first source/drain regions and second source/drain regions using a thermal anneal at a temperature of greater than 800° C.; and following the thermal anneal, forming recessed epitaxial SiC regions in the substrate on opposing sides of the second gate structure and offset by a second distance $d_2$ from sidewalls of the second gate electrode using the second gate sidewall spacers and the second source/drain spacers, wherein the recessed epitaxial SiC regions replace portions of the activated second source/drain regions, and wherein other portions of the activated second source/drain regions remain which are not located within the recessed epitaxial SiC regions.

22. The method of claim 21, wherein $d_2 > d_1$.

23. The method of claim 22, further comprising, after forming the recessed epitaxial SiC regions, applying a thermal anneal at a temperature below about 1000° C.

* * * * *